United States Patent
Katona et al.

(10) Patent No.: US 9,564,553 B2
(45) Date of Patent: Feb. 7, 2017

(54) POWER LIGHT EMITTING DIODE AND METHOD WITH UNIFORM CURRENT DENSITY OPERATION

(71) Applicant: SORAA, INC., Fremont, CA (US)

(72) Inventors: Thomas M. Katona, Fremont, CA (US); James W. Raring, Fremont, CA (US); Mark P. D'Evelyn, Santa Barbara, CA (US); Michael R. Krames, Mountain View, CA (US); Aurelien J. F. David, San Francisco, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 15/074,665

(22) Filed: Mar. 18, 2016

(65) Prior Publication Data
US 2016/0204308 A1    Jul. 14, 2016

Related U.S. Application Data

(63) Continuation of application No. 14/040,379, filed on Sep. 27, 2013, now Pat. No. 9,293,644, and a continuation-in-part of application No. 13/931,359, filed on Jun. 28, 2013, now Pat. No. 8,686,458, which is a continuation of application No. 12/936,238, filed as application No. PCT/US2010/049531 on Sep. 20, 2010, now Pat. No. 8,502,465.

(60) Provisional application No. 61/778,002, filed on Mar. 12, 2013, provisional application No. 61/243,988, filed on Sep. 18, 2009.

(51) Int. Cl.
| | |
|---|---|
| *H05B 37/02* | (2006.01) |
| *H01L 29/22* | (2006.01) |
| *H01L 33/02* | (2010.01) |
| *H01L 33/32* | (2010.01) |
| *H01L 33/40* | (2010.01) |
| *H01L 33/16* | (2010.01) |
| *H01L 33/20* | (2010.01) |

(52) U.S. Cl.
CPC ............... *H01L 33/02* (2013.01); *H01L 33/32* (2013.01); *H01L 33/405* (2013.01); *H01L 33/16* (2013.01); *H01L 33/20* (2013.01)

(58) Field of Classification Search
CPC .............. H05B 37/02; F21K 9/56; F21K 9/13; F21K 9/135; F21K 9/137; F21V 29/22; F21V 3/00; F21Y 2101/02; F21Y 2113/005; F21Y 2924/0002; H01L 25/0753; H01L 33/00; H01L 33/02; H01L 33/16; H01L 33/20; H01L 33/32; H01L 33/405; H01L 33/504; H01L 27/153
USPC ............. 315/291, 307, 308; 257/79, 98, E33
See application file for complete search history.

(56) References Cited

U.S. PATENT DOCUMENTS

2006/0017061 A1 *   1/2006   Sakamoto ............... H01L 33/20
                                                      257/103

* cited by examiner

*Primary Examiner* — Jimmy Vu
(74) *Attorney, Agent, or Firm* — Saul Ewing LLP

(57) ABSTRACT

A light emitting diode device has a bulk gallium and nitrogen containing substrate with an active region. The device has a lateral dimension and a thick vertical dimension such that the geometric aspect ratio forms a volumetric diode that delivers a nearly uniform current density across the range of the lateral dimension.

20 Claims, 15 Drawing Sheets

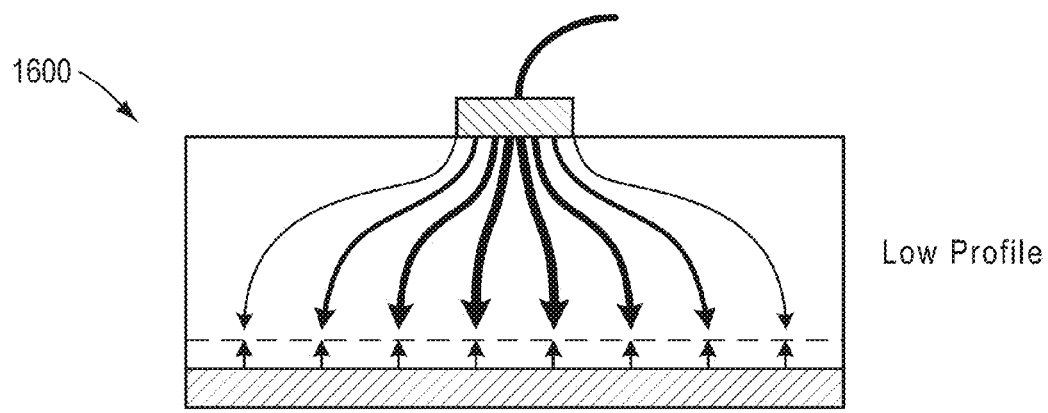
FIG. 16A  Low Profile
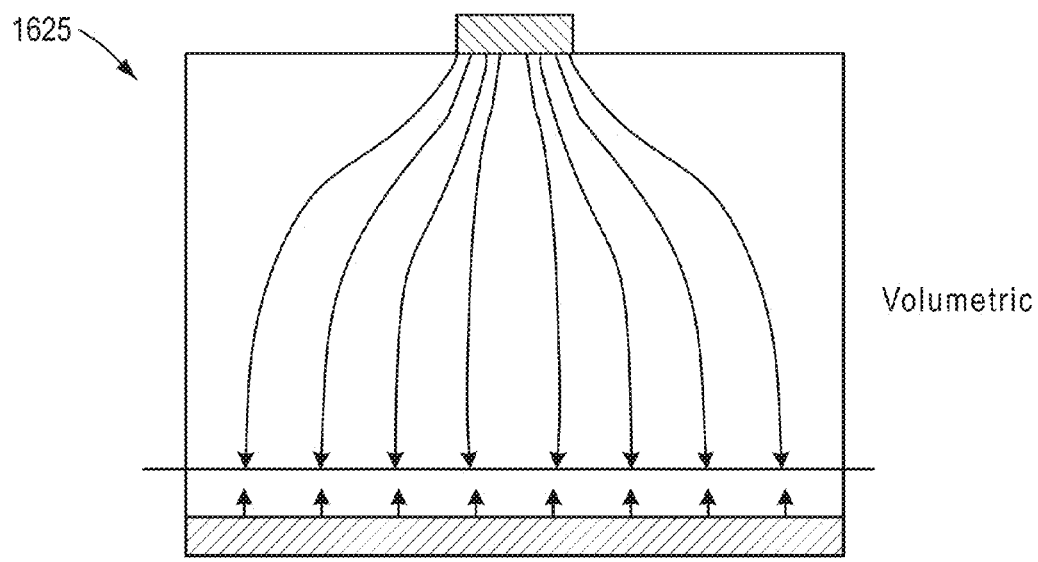
FIG. 16B  Volumetric
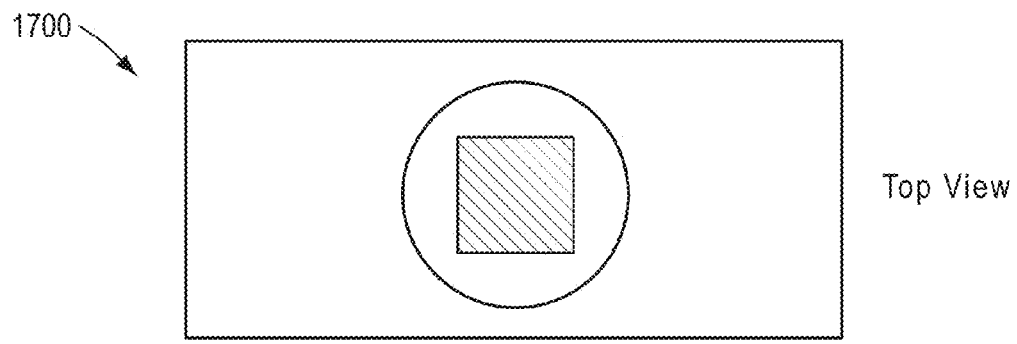
FIG. 17  Top View

POWER LIGHT EMITTING DIODE AND METHOD WITH UNIFORM CURRENT DENSITY OPERATION

This application is a continuation of U.S. application Ser. No. 14/040,379 filed on Sep. 27, 2013, which claims the benefit under 35 U.S.C. §119(e) of U.S. Application No. 61/778,002 filed on Mar. 12, 2013; and U.S. application Ser. No. 14/040,379 is a continuation-in-part of U.S. application Ser. No. 13/931,359 filed on Jun. 28, 2013, now U.S. Pat. No. 8,686,458, which is a continuation of U.S. application Ser. No. 12/936,238 filed on Jul. 29, 2011, now U.S. Pat. No. 8,502,465, which is a 371 of PCT International Application No. PCT/US2010/49531 filed on Sep. 20, 2010, which claims priority to U.S. Provisional Application No. 61/243,988, filed on Sep. 18, 2009, each of which is incorporated by reference in its entirety.

BACKGROUND

This invention relates generally to lighting techniques, and in particular to techniques for high current density LED devices fabricated on bulk gallium and nitrogen containing polar, semipolar or nonpolar materials. The invention can be applied to applications such as white lighting, multi-colored lighting, lighting for flat panel displays, other optoelectronic devices, and similar products.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to AC power or DC power. The conventional light bulb can be found in houses, buildings, and outdoor lighting, as well as in other areas requiring light. Unfortunately, more than 90% of the energy used for the conventional light bulb dissipates as thermal energy. Additionally, the conventional light bulb routinely fails often due to thermal expansion and contraction of the filament element.

Fluorescent lighting overcomes some of the drawbacks of the conventional light bulb. Fluorescent lighting uses an optically clear tube structure filled with a noble gas and mercury. A pair of electrodes is coupled between the halogen gas and couples to an alternating power source through a ballast. Once the gas has been excited, the resulting mercury vapor discharges to emit UV light. Usually the tube is coated with phosphors excitable by the UV emission to make white light. Many building structures use fluorescent lighting and, more recently, fluorescent lighting has been fitted onto a base structure, which couples into a standard socket.

Solid state lighting techniques are also known. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue emitting LEDs. The blue colored LEDs lead to innovations such as state white lighting, and other developments. Other colored LEDs have also been proposed, although limitations still exist with solid state lighting. Further details of such limitations are described throughout the present specification and more particularly below.

A challenge for solid state lighting is the high cost of LED-based lighting. Cost often is directly proportional to the semiconductor material real estate used to produce a given amount of light. To reduce cost, more lumens must be generated per unit area of semiconductor material. Conventional InGaN LEDs, however, suffer from efficiency "droop" where internal quantum efficiency reduces as current density is increased. The current density for maximum efficiency, $J_{max}$, is typically 1 A/cm$^2$ to 10 A/cm$^2$ which is a very low current density. Also, at higher power densities, current crowding and thermal gradients can result in poor performance and reliability issues. These phenomena make it difficult to reduce cost by increasing current density, as a minimum efficiency is necessary to provide energy savings for LEDs above conventional approaches like fluorescent and incandescent lighting. These and other limitations are described in further detail throughout the present specification and more particularly below.

From the above, it is seen that techniques for improving optical devices is highly desired.

BRIEF SUMMARY

According to the present invention, techniques related generally to lighting are provided. Specifically, techniques for generating increased light output per unit area of GaN-based semiconductor material are described. More specifically, embodiments of the invention include high current density LED devices, with high active area utilization (i.e., ratio of active region area to dicing pitch), fabricated on bulk gallium and nitrogen containing polar, semipolar or nonpolar materials.

Conventional GaN-based LEDs are fabricated by epitaxial growth of device layers on foreign substrates, such as sapphire, Silicon Carbide (SiC), or Silicon (Si). In the case of sapphire, a lateral injection geometry is mandated due to the electrically insulating properties of sapphire. The lateral geometry may be top-emitting, through semi-transparent ohmic contact metallization, or bottom-emitting (i.e., "Flip-Chip, or FC geometry). Otherwise, the sapphire substrate may be removed and a thin-film approach employed, wherein the epitaxial device layers are transferred onto a carrier substrate or package element. For Si, high light extraction efficiency requires that the Si substrate be removed, mandating a thin-film approach. For SiC, either a lateral or thin-film approach is feasible.

For a fixed light output level, the main lever for reducing cost is by decreasing the LED semiconductor area required for the lighting product. Reducing the total LED chip area effectively increases semiconductor manufacturing plant output, while reducing the size of optics and other components used in final product assembly. Reducing chip size increases current density, but high external quantum efficiency may be maintained at high current density using epitaxial techniques of the present invention described below. Chip design also plays a critical role. Chip size reduction for lateral chips (either top or substrate emitting) is problematic as fabrication tolerances can reduce active area utilization as chip size is reduced.

This effect is illustrated in FIG. 1A-1C. FIG. 1A-1C illustrates chip size for (a) lateral injection (e.g., flip-chip shown) based LEDs, (b) vertical thin-film based LEDs, and (c) bulk-substrate based LEDs. Lateral-injection devices (whether top or bottom contacted) require area for making both anode and cathode connections on the same side of the device. This fundamentally reduces active area utilization (portions of the die footprint are required for the cathode) and puts a practical limit on die size. Assuming lithography tolerances of 5 µm, a die-attach tolerance of 25 µm, and a bump diameter of 75 μm, the active area utilization vs. chip width is as shown in FIG. 1A-1C. For SiC, a conductive buffer layer approach allows the use of a vertical injection design. However, the lattice mismatch between SiC and GaN results in high dislocation densities (>1×10$^8$ cm$^{-2}$) which can cause unreliability at high power densities. Also, SiC has a higher refractive index than GaN, making the issue of light extraction a more difficult problem.

For devices grown on insulating substrates (such as sapphire) or thinned-down devices with only a few μm of GaN, an additional problem is current crowding. Even if the GaN layer is highly doped, electrons will not spread efficiently at high current density across the lateral dimension of the die. This results in an uneven lateral current profile 1600 such as on FIG. 16A, with more electrons injected directly under the n-contact and fewer electrons father away from the contact. This is undesirable for several reasons; first, regions of higher current density will suffer more droop; second, light is emitted preferentially under the n-contact which may negatively impact light extraction; third, current crowding may negatively impact device reliability.

This invention provides a light emitting diode which includes a bulk gallium and nitrogen containing substrate with a surface region. One or more active regions are formed overlying the surface region, with a current density of greater than about 175 Amps/cm$^2$ characterizing the one or more active regions. The device has an external quantum efficiency (EQE) of 40% (or 50%, 60%, 70%, 80%, 90%) and greater.

In an alternative embodiment, the invention provides an alternative type light emitting diode device, but which also includes a bulk gallium and nitrogen containing substrate and one or more active regions formed overlying the surface region. The device also has a current density of greater than about 200 A/cm$^2$ characterizing the active regions, and an emission characterized by a wavelength of 385 nm to 480 nm. In a specific embodiment, the device has desired red, green, blue, or other emitting phosphor materials operably coupled to the primary device emission to provide a white light source.

In another embodiment, the invention provides a light emitting diode device with a bulk gallium and nitrogen containing substrate having a non-polar orientation. The device also has active regions formed overlying the surface region and a current density of greater than about 500 A/cm$^2$ characterizing the active regions. The device has an emission characterized by a wavelength of 385 nm to 415 nm and one or more RGB or other color phosphor materials operably coupled to the emission to provide a white light source. In a further specific embodiment, the device has a current density of greater than about 500 A/cm$^2$ characterizing the active regions and an emission characterized by a wavelength of 385 nm to 415 nm.

In further embodiments, the invention provides a method of operating a light emitting diode device of the type described above. The method subjects the optical device to an electrical current such that a junction region of the active regions provides a current density of greater than about 200 Amps/cm$^2$ and outputs electromagnetic radiation having wavelengths between 385 nm to 480 nm. The device preferably includes a package enclosing at least the bulk gallium and nitrogen containing substrate and active regions. Preferably, the package is characterized by a thermal resistance of 15 or 10 or 5 or 1 degrees per Watt and less.

In certain embodiments, a light emitting diode provided by the present disclosure has an external quantum efficiency of at least 40%, at least 50%, and/or at least 60%, at a forward current density of at least 175 A/cm$^2$, at least 200 A/cm$^2$, at least 300 A/cm$^2$, at least 400 A/cm$^2$, at least 500 A/cm$^2$, at least 600 A/cm$^2$, at least 700 A/cm$^2$, at least 800 A/cm$^2$, at least 900 A/cm$^2$, and/or at least 1,000 A/cm$^2$ In certain embodiments, a light emitting diode exhibits any or all of the above external quantum efficiencies and forward current densities when operating at emission wavelengths from 405 nm to 430 nm, from 385 nm to 415 nm, from 385 nm to 480 nm, from 390 nm to 430 nm, or others. These values may apply for all or most of the recited wavelength ranges.

In another embodiment the light emitting diode device has a current density of greater than about 175 Amps/cm$^2$ characterizing the one or more active regions. Additionally, the device has an internal quantum efficiency (IQE) of at least 50%; and a lifetime of at least about 5000 hours operable at the current density.

In another embodiment, the bulk gallium and nitrogen containing substrate is n-doped. Further, the thickness of the LED can be optimized as follows:

(1) The LED is formed to be thick enough (e.g., as shown in the example of FIG. 16B) to enable efficient lateral current spreading (e.g., see profile 1625) through the substrate and enable a uniform current density in the active region, across the device (e.g., across the lateral dimension of the device); and (2) The LED is sufficiently thin that vertical resistance does not negatively impact its performance.

Still further, the invention provides a method for manufacturing a light emitting diode device. The method includes providing a bulk gallium and nitrogen containing substrate having a surface region and forming first epitaxial material over the surface region. The device also includes one or more active regions formed overlying the epitaxial material preferably configured for a current density of greater than about 175 Amps/cm$^2$. The method can also include forming second epitaxial material overlying the active regions and forming contact regions.

The present invention provides an LED optical device with an active area utilization characterizing the active area which is greater than 50%. In other embodiments, the utilization is >80%, >90%, or >95%. Also the invention enables a device with a ratio characterizing the emitting outer surface area to active region area of greater than 1, and in other embodiments, the ratio is >5, >10, or >100.

Still further, the present invention provides an apparatus, e.g., light bulb or fixture. The apparatus has one or more LEDs having a cumulative die surface area of less than about 1 mm$^2$ and configured to emit at least 300 lumens. In a specific embodiment, the LEDs consists of a single LED fabricated from a gallium and nitrogen containing material having a semipolar, polar, or non-polar orientation. If more than one LED is provided they are preferably configured in an array.

Typically, the LED has an active junction area of a size with an active junction area of less than about 1 mm$^2$', is less than about 0.75 mm$^2$', is less than about 0.5 mm$^2$', is less than about 0.3 mm$^2$. In a specific embodiment, the apparatus emits at least 300 lumens, at least 500 lumens, or at least 700 lumens. In a specific embodiment, the emission is substantially white light or in ranges of 390-415 nm, 415-440 nm, 440-470 nm, and others. In other embodiments, the LED is characterized by an input power per active junction area of greater than 2 watts/mm$^2$', of greater than 3 watts/mm$^2$', of greater than 5 watts/mm$^2$', of greater than 10 watts/mm$^2$', of greater than 15 watts/mm$^2$', of greater than 20 watts/mm$^2$', or others. Depending upon the embodiment, the LED is characterized by a lumens per active junction area of greater than 300 lm/mm$^{2t}$ for a warm white emission with a CCT of less than about 5000K and CRI of greater than about 75. Alternatively, the LED is characterized by a lumens per active junction area of greater than 400 lm/mm$^{2t}$ for a warm white emission with a CCT of greater than about 5000K and CRI of greater than about 75. Alternatively, the LEDs is characterized by a lumens per active junction area of greater than 600 lm/mm$^{2t}$ for a warm white emission with a CCT of greater than about 5,000K and CRI of greater than about 75. Alternatively, the LEDs is characterized by a lumens per active junction area of greater than 800 lm/mm$^{2t}$ for a warm white emission with a CCT of greater than about 5000K and CRI of greater than about 75.

The LEDs described herein can have a current density of greater than about 175 Amps/cm$^2$ characterizing the active regions and an external quantum efficiency characterized by a roll off of less than about 5% in absolute efficiency, as measured from a maximum value compared to the value at a predetermined increased operating current density, and an emission characterized by a wavelength of 390 nm to 480 nm.

The present LED is operable at a junction temperature greater than 100° C., greater than 150° C., and/or greater than 200° C., and even higher. In preferred embodiments, the present device is operable in un-cooled state and under continuous wave operation. The present LED device also has a current density that may range from about 175 A/cm$^2$ to about 1 kA/cm$^2$ or more. In one or more preferred embodiments, the current density is also about 400 A/cm$^2$ to 800 A/cm$^2$.

The device and method herein provide for higher yields over conventional techniques in fabricating LEDs. In other embodiments, the present method and resulting structure are easier to form using conventional techniques and gallium and nitrogen containing substrate materials having polar, non-polar or semipolar surface orientations. The present invention provides a resulting device and method for high current density LED devices having smaller feature sizes and substantially no "Droop." In a preferred embodiment, the device provides a resulting white light fixture that uses substantially reduced LED semiconductor area, as compared to conventional devices. In a preferred embodiment, the present LED active region designs are configured for reducing droop, enabling chip architectures that operate efficiently at high current densities.

A further understanding of the nature and advantages of the present invention may be realized by reference to the specification and attached drawings.

BRIEF DESCRIPTION OF THE DRAWINGS

FIG. 16A is a cross-section of a thin-film LED with arrows of varying thicknesses showing the flow of electrons and holes.

FIG. 16B is a cross-section of a thick LED with a doped substrate, with arrows showing the flow of electrons and holes, according to an embodiment of the present invention.

FIG. 17 is a top view of one embodiment of the LEDs of FIGS. 16A and 16B.

DETAILED DESCRIPTION

Figure 1A:
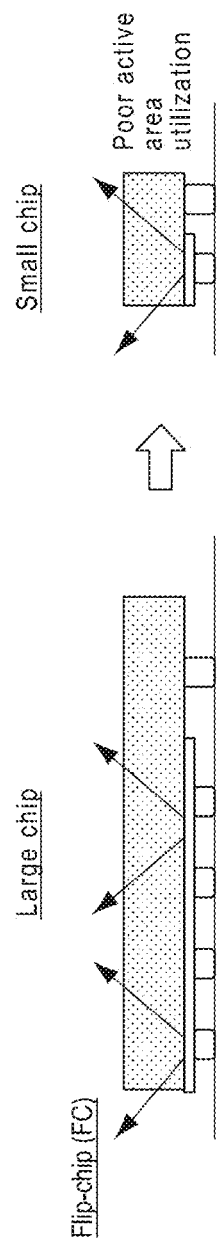
FIG. 1A-1C is a simplified illustration of chip size for FIG. 1A lateral injection (e.g., flip-chip shown), FIG. 1B vertical thin-film, and FIG. 1C bulk-substrate based LEDs according to embodiments of the present invention.

This invention relates generally to lighting techniques, and in particular to techniques for high current density LED devices fabricated on bulk gallium and nitrogen containing polar, semipolar or nonpolar materials. The invention can be applied to applications such as white lighting, multi-colored lighting, lighting for flat panel displays, other optoelectronic devices, and similar products.

The disclosure herein relates to making and using a light emitting diode device emitting at a wavelength of 390 nm to 470 nm or at a wavelength of 405 nm to 430 nm. Some of the disclosed embodiments address the desirability of uniform current density across the active region, and some of the device embodiments comprise a bulk gallium and nitrogen containing substrate with a growth to form an active region. Exemplary devices are characterized by having a geometric relationship (e.g., aspect ratio) between a lateral dimension of the device and a vertical dimension of the device such that the geometric aspect ratio forms a volumetric LED that delivers a substantially flat current density across the device (e.g., as measured across a lateral dimension of the active region). Moreover, exemplary devices are characterized by having a current density in the active region of greater than about 175 Amps/cm$^2$.

The herein-disclosed recent breakthroughs in the field of GaN-based optoelectronics have demonstrated the great potential of devices fabricated on bulk polar, nonpolar and semipolar GaN substrates. Specifically for nonpolar and semipolar orientations, the lack of strong polarization induced electric fields that plague conventional devices on c-plane GaN leads to a greatly enhanced radiative recombination efficiency in the light emitting InGaN layers. For polar materials, the deleterious effects of polarization fields may be reduced by reducing the InN content of the active region, and/or reducing the barrier thicknesses in multi-quantum well (MQW) active region structures. Also, for any surface orientation, the bulk native substrate provides for simplified device geometry that may be scaled down to provide lower costs (in dollars per lumen) compared to approaches based on foreign substrates like sapphire SiC, or Si. Furthermore, the reduced dislocation densities provided by bulk GaN offer assurance of high reliability at high current densities, which is not guaranteed by foreign substrate approaches.

Of particular importance to the field of lighting is the progress of light emitting diodes (LED) fabricated on non-polar and semipolar GaN substrates. Such devices making use of InGaN light emitting layers have exhibited record output powers at extended operation wavelengths into the violet region (390-430 nm), the blue region (430-490 nm), the green region (490-560 nm), and the yellow region (560-600 nm). For example, a violet LED, with a peak emission wavelength of 402 nm, was recently fabricated on an m-plane (1-100) GaN substrate and demonstrated greater than 45% external quantum efficiency, despite having no light extraction enhancement features, and showed excellent performance at high current densities, with minimal roll-over [K.-C. Kim, M. C. Schmidt, H. Sato, F. Wu, N. Fellows, M. Saito, K. Fujito, J. S. Speck, S. Nakamura, and S. P. DenBaars, "Improved electroluminescence on nonpolar m-plane InGaN/GaN quantum well LEDs", Phys. Stat. Sol. (RRL) 1, No. 3, 125 (2007).]. Similarly, a blue LED, with a peak emission wavelength of 468 nm, exhibited excellent efficiency at high power densities and significantly less roll-over than is typically observed with c-plane LEDs [K. Iso, H. Yamada, H. Hirasawa, N. Fellows, M. Saito, K. Fujito, S. P. DenBaars, J. S. Speck, and S. Nakamura, "High brightness blue InGaN/GaN light emitting diode on nonpolar m-plane bulk GaN substrate", Japanese Journal of Applied Physics 46, L960 (2007)]. Two promising semipolar orientations are the (10-1-1) and (11-22) planes. These planes are inclined by 62.0 degrees and by 58.4 degrees, respectively, with respect to the c-plane. University of California, Santa Barbara (UCSB) has produced highly efficient LEDs on (10-1-1) GaN with over 65 mW output power at 100 mA for blue-emitting devices [H. Zhong, A. Tyagi, N. Fellows, F. Wu, R. B. Chung, M. Saito, K. Fujito, J. S. Speck, S. P. DenBaars, and S. Nakamura, "High power and high efficiency blue light emitting diode on freestanding semipolar (1011) bulk GaN substrate", Applied Physics Letters 90, 233504 (2007)] and on (11-22) GaN with over 35 mW output power at 100 mA for blue-green emitting devices [H. Zhong, A. Tyagi, N. N. Fellows, R. B. Chung, M. Saito, K. Fujito, J. S. Speck, S. P. DenBaars, and S. Nakamura, Electronics Lett. 43, 825 (2007)], over 15 mW of power at 100 mA for green-emitting devices [H. Sato, A. Tyagi, H. Zhong, N. Fellows, R. B. Chung, M. Saito, K. Fujito, J. S. Speck, S. P. DenBaars, and S. Nakamura, "High power and high efficiency green light emitting diode on free-standing semipolar (1122) bulk GaN substrate", Physical Status Solidi—Rapid Research Letters 1, 162 (2007)] and over 15 mW for yellow devices [H. Sato, R. B. Chung, H. Hirasawa, N. Fellows, H. Masui, F. Wu, M. Saito, K. Fujito, J. S. Speck, S. P. DenBaars, and S. Nakamura, "Optical properties of yellow light-emitting diodes grown on semipolar (1122) bulk GaN substrates," Applied Physics Letters 92, 221110 (2008)]. The UCSB group has shown that the indium incorporation on semipolar (11-22) GaN is comparable to or greater than that of c-plane GaN, which provides further promise for achieving high crystal quality extended wavelength emitting InGaN layers.

A non-polar or semi-polar LED may be fabricated on a bulk gallium nitride substrate. The gallium nitride substrate may be sliced from a boule that was grown by hydride vapor phase epitaxy or ammonothermally, according to methods known in the art. In one specific embodiment, the gallium nitride substrate is fabricated by a combination of hydride vapor phase epitaxy and ammonothermal growth, as disclosed in U.S. Patent Application No. 61/078,704, commonly assigned, and hereby incorporated by reference herein. The boule may be grown in the c-direction, the m-direction, the a-direction, or in a semi-polar direction on a single-crystal seed crystal. Semipolar planes may be designated by (hkil) Miller indices, where i=−(h+k), l is nonzero and at least one of h and k are nonzero. The gallium nitride substrate may be cut, lapped, polished, and chemical-mechanically polished. The gallium nitride substrate orientation may be within ±5 degrees, ±2 degrees, ±1 degree, or ±0.5 degrees of the {1 −1 0 0} m plane, the {1 1 −2 0} a plane, the {1 1 −2 2} plane, the {2 0 −2±1} plane, the {1 −1 0±1} plane, the {1 0 −1 ±1} plane, the {1 −1 0 −±2} plane, or the {1 −1 0±3} plane. The gallium nitride substrate may have a dislocation density in the plane of the large-area surface that is less than $10^6$ cm$^{-2}$, less than $10^5$ cm$^{-2}$, less than $10^4$ cm$^{-2}$, or less than $10^3$ cm$^{-2}$. The gallium nitride substrate may have a dislocation density in the c plane that is less than $10^6$ cm$^{-2}$, less than $10^5$ cm$^{-2}$, less than $10^4$ cm$^{-2}$, or less than $10^3$ cm$^{-2}$.

A homoepitaxial non-polar or semi-polar LED is fabricated on the gallium nitride substrate according to methods that are known in the art, for example, following the methods disclosed in U.S. Pat. No. 7,053,413, which is incorporated by reference in its entirety. At least one Al$_x$In$_y$Ga$_{1-x-y}$N layer, where 0≤x≤1, 0≤y≤1, and 0≤x+y≤1, is deposited on the substrate, for example, following the methods disclosed by U.S. Pat. Nos. 7,338,828 and 7,220,324, which are hereby incorporated by reference in their entirety. The at least one Al$_x$In$_y$Ga$_{1-x-y}$N layer may be deposited by metal-organic chemical vapor deposition, by molecular beam epitaxy, by hydride vapor phase epitaxy, or by a combination thereof. In one embodiment, the $Al_xIn_yGa_{1-x-y}N$ layer comprises an active layer that preferentially emits light when an electrical current is passed through it. In one specific embodiment, the active layer comprises a single quantum well, with a thickness between about 0.5 nm and about 40 nm. In a specific embodiment, the active layer comprises a single quantum well with a thickness between about 1 nm and about 5 nm. In other embodiments, the active layer comprises a single quantum well with a thickness between about 5 nm and about 10 nm, between about 10 nm and about 15 nm, between about 15 nm and about 20 nm, between about 20 nm and about 25 nm, between about 25 nm and about 30 nm, between about 30 nm and about 35 nm, or between about 35 nm and about 40 nm. In another set of embodiments, the active layer comprises a multiple quantum well. In still another embodiment, the active region comprises a double heterostructure, with a thickness between about 40 nm and about 500 nm. In one specific embodiment, the active layer comprises an $In_yGa_{1-y}N$ layer, where $0 \leq y \leq 1$. Of course, there can be other variations, modifications, and alternatives.

Furthermore, as the input current in a light emitting diode is increased, the optical output power increases as the associated higher number of injected electrons are converted into photons. In an "ideal" LED the light output would continue increasing linearly with increased current such that small LEDs could be driven to very high current densities to achieve high output power. In practice, however, this light output versus current input characteristic of light emitting diodes has been fundamentally limited by a phenomenon where the radiative efficiency of conventional light emitting diodes decreases as the current density increases. It has been observed that such phenomena causes rollover or a sublinear increase in output power versus current. This results in only marginal increase in total flux as the input current is increased.

Figure 3:
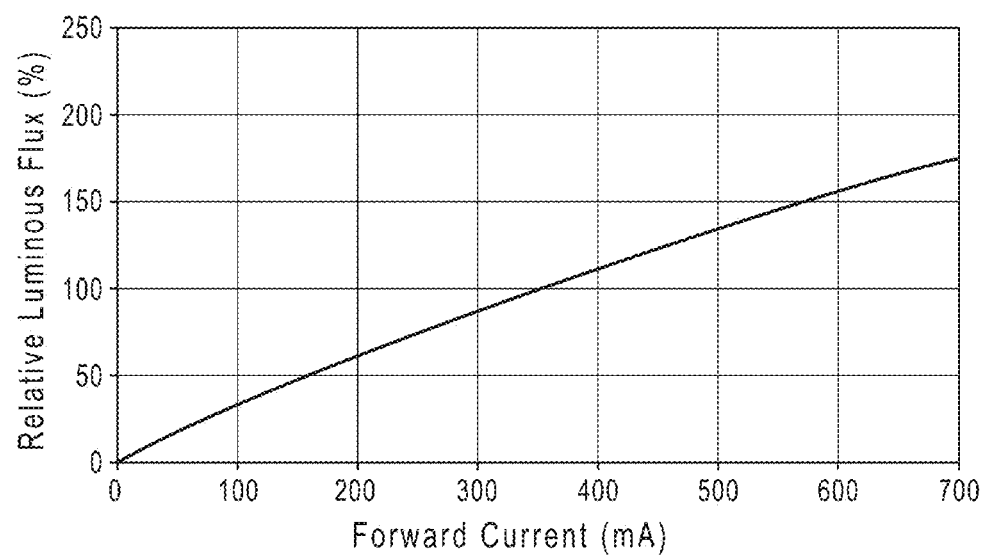
FIG. 3 shows a sample plot of relative luminous flux as a function of injection current for a conventional LED, a Cree XP-E white LED with junction temperature of 25° C.

FIG. 3 shows a sample plot of relative luminous flux as a function of injection current for a conventional LED, a Cree XP-E white LED with junction temperature of 25° C. The plot shows that the relative luminous flux at 350 mA (approximately 30 A/cm² to 50 A/cm²) is 100% while at 700 mA the relative luminous flux is only approximately 170%. This shows that for a conventional LED a roll-off in efficiency for the LED of approximately 15% occurs over the operating range from approximately 30 A/cm² to 50 A/cm² to 60 A/cm² to 100 A/cm². In addition, the peak efficiency for this diode occurs at an even lower operating current density, indicating that the roll-off in efficiency from the peak value is even greater than 15% were the diode to be operated at 700 mA.

Due to the phenomenon, conventional light emitting diodes are typically operated at lower current densities than provided by the present method and devices, ranging from 10 A/cm² to 100 A/cm². This operating current density restriction has placed practical limits on the total flux that is possible from a single conventional light emitting diode. Common approaches to increase the flux from an LED package include increasing the active area of the LED (thereby allowing the LED to have a higher operating current while maintaining a suitably low current density), and packaging several LED die into an array of LEDs, whereby the total current is divided amongst the LEDs in the package. While these approaches have the effect of generating more total flux per LED package while maintaining a suitably low current density, they are inherently more costly due to the requirement of increased total LED die area. In one or more embodiments, we propose a method and device for lighting based on one or more small-chip high brightness LEDs offering high efficiency operating at current densities in excess of conventional LEDs, while maintaining a long operating lifetime.

Figure 1B:
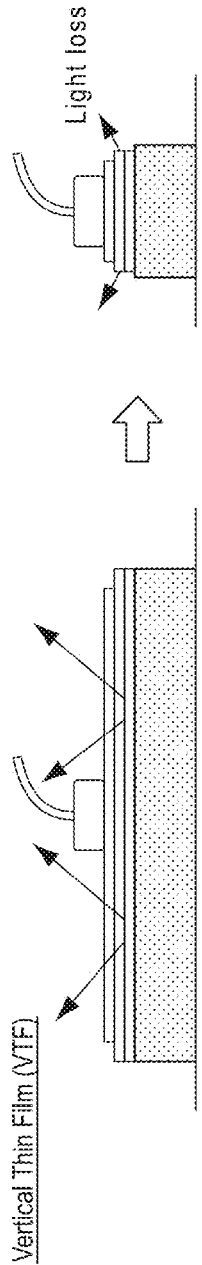
Figure 1C:
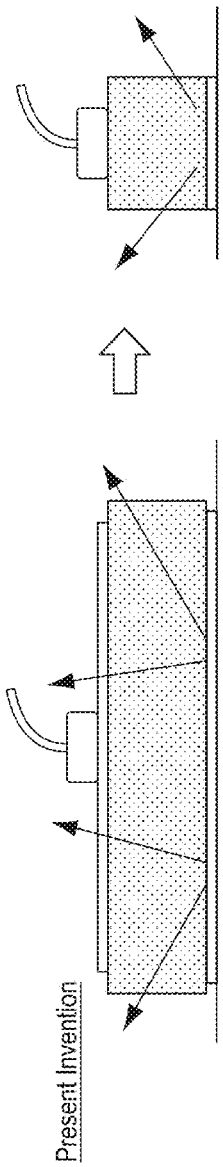
Figure 2:
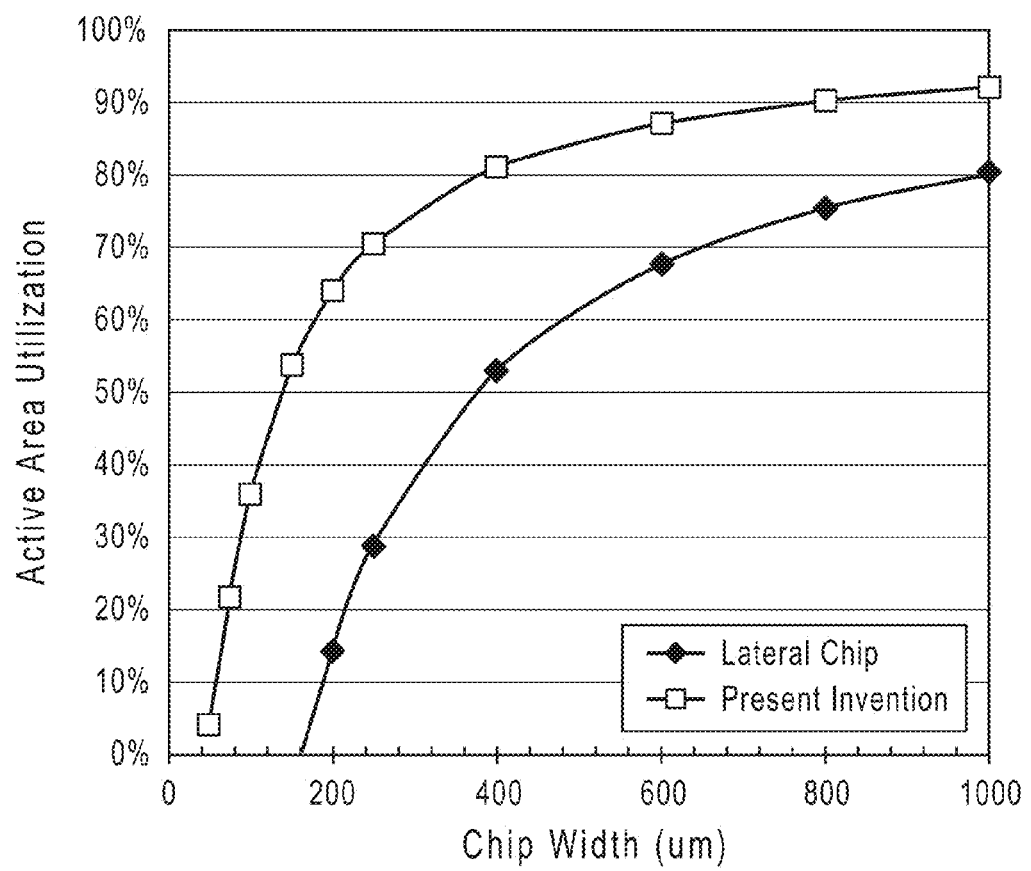
FIG. 2 illustrates active area utilization (ratio of active area to device footprint) as a function of chip width for lateral chip designs compared with the present invention, assuming lithography tolerances of 5 μm, a die-attach tolerance of 25 μm, and a bump diameter of 75 μm.

There is a large body of work that establishes conventional knowledge of the limitations of operating LEDs at high current density with efficient operation. This body of work includes the similarity in operating current density for high brightness LEDs that have been commercialized by the largest LED manufacturers, and a large body of work referencing the "LED Droop" phenomena. Examples of commercial LEDs include Cree's XP-E, XR-E, and MC-E packages and Lumileds K2 and Rebel packages, with one such example shown in FIG. 1A-1C. Similar high brightness LEDs are available from companies such as Osram, Nichia, Avago, Bridgelux, etc. that all operate in a current density range much lower than proposed in this invention either through limiting the total current, increasing the die size beyond 1 mm², or packaging multiple LED chips to effectively increase the LED junction area. Examples of literature referencing and showing the LED "droop" phenomena are described by Shen et al. in Applied Physics Letters, 91, 141101 (2007), and Michiue et. al. in the Proceedings of the SPIE Vol. 7216, 72161Z-1 (2009) by way of example. In addition, Gardner et al. in Applied Physics Letters, 91, 243506 (2007) explicitly state in reference to this phenomena and attempts to overcome it that typical current densities of interest for LEDs are 20-400 A/cm² with their double heterostructure LED grown on a sapphire substrate showing a peak efficiency at approximately 200 A/cm² and then rolling off above that operating point. In addition to the limits in maintaining device efficiency while operating at high current density, it has been shown that as the current density is increased in light emitting devices, the lifetime of the devices degrade below acceptable levels with this degradation being correlated with dislocations in the material. Tomiya et. al. demonstrated in IEEE J. of Quantum Elec., Vol. 10, No. 6 (2004) that light emitting devices fabricated on reduced dislocation density material allowed for higher current operation without the decrease in lifetime that was observed for devices fabricated on high dislocation material. In their studies, dislocation reduction was achieved by means of lateral epitaxial overgrowth on material grown heteroepitaxially. To date, conventional methods related to light emitting diodes related to alleviating or minimizing the droop phenomena have not addressed growth and device design of light emitting diodes grown and fabricated on bulk substrates. A further explanation of conventional LED devices and their quantum efficiencies are described in more detail below.

Figure 4:
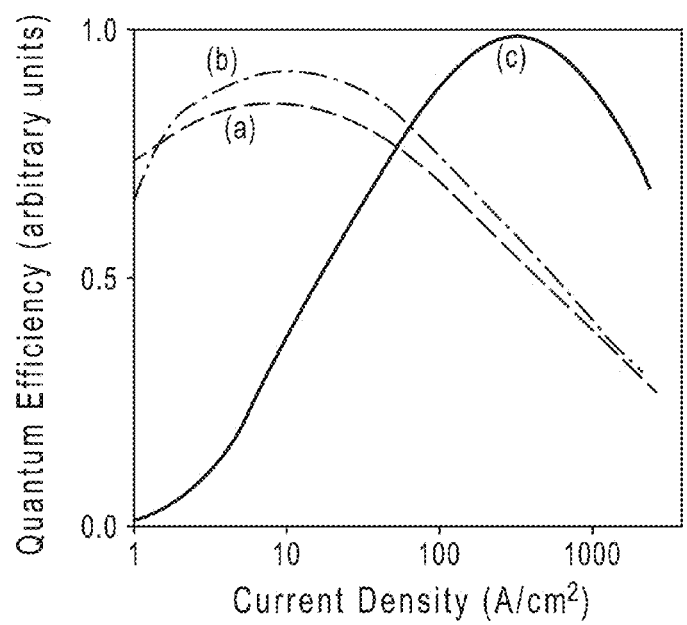
FIG. 4 shows an external quantum efficiency as a function of current density for (a) a multiple quantum well LED with two 2.5 nanometer wells, (b) a multiple quantum well LED with six 2.5 nanometer quantum wells, and (c) a double heterostructure LED with a 13 nanometer active region. Each of the LEDs exhibited emission at ~430 nm.

FIG. 4 is taken from N. F. Gardner et al., "Blue-emitting InGaN-GaN double-heterostructure light-emitting diodes reaching maximum quantum efficiency above 200 A/cm²", Applied Physics Letters 91, 243506 (2007), and shows two types of variations in the external quantum efficiency as a function of current density that are known in the prior art. The behavior shown in lines (a) and (b) of FIG. 4 are representative of that of conventional LEDs. With one or more relatively thin quantum wells, for example, less than about 4 nanometers thick, the external quantum efficiency peaks at a current density of about 10 amperes per square centimeter or less and drops relatively sharply at higher current densities. The external quantum efficiency at higher current densities can be increased by increasing the thickness of the active layer, for example, to approximately 13 nanometers, as shown in by line (c) in FIG. 4. However, in this case the external quantum efficiency is very low at current densities below about 30 amperes per square centimeter (A/cm$^2$) and also at current densities above about 300 A/cm$^2$, with a relatively sharp maximum in between. Ideal would be an LED with an external quantum efficiency that was approximately constant from current densities of about 20 A/mo′to current densities above about 200 A/cm$^2$, above about 300 A/cm$^2$, above about 400 A/cm$^2$, above about 500 A/cm$^2$, or above about 1000 A/cm$^2$.

M. Schmidt et. al. in Jap. J. of Appl. Phys. Vol. 46, No. 7, 2007 previously demonstrated an LED with a peak emission wavelength of 408 nm that was grown on a bulk non-polar m-Plane substrate with a threading dislocation density of less than 1×10$^6$ cm$^{-2}$. Despite the use of a high-quality bulk substrate with a non-polar orientation, the devices demonstrated in this work showed a roll-off in peak external quantum efficiency of approximately 5% over the relatively narrow operating current density of 11 A/cm$^2$ to 111 A/cm$^2$, much lower than the values achieved in the current invention. These and other limitations of conventional techniques have been overcome in part by the present method and devices, which are described throughout the present specification and more particularly below.

Figure 4A:
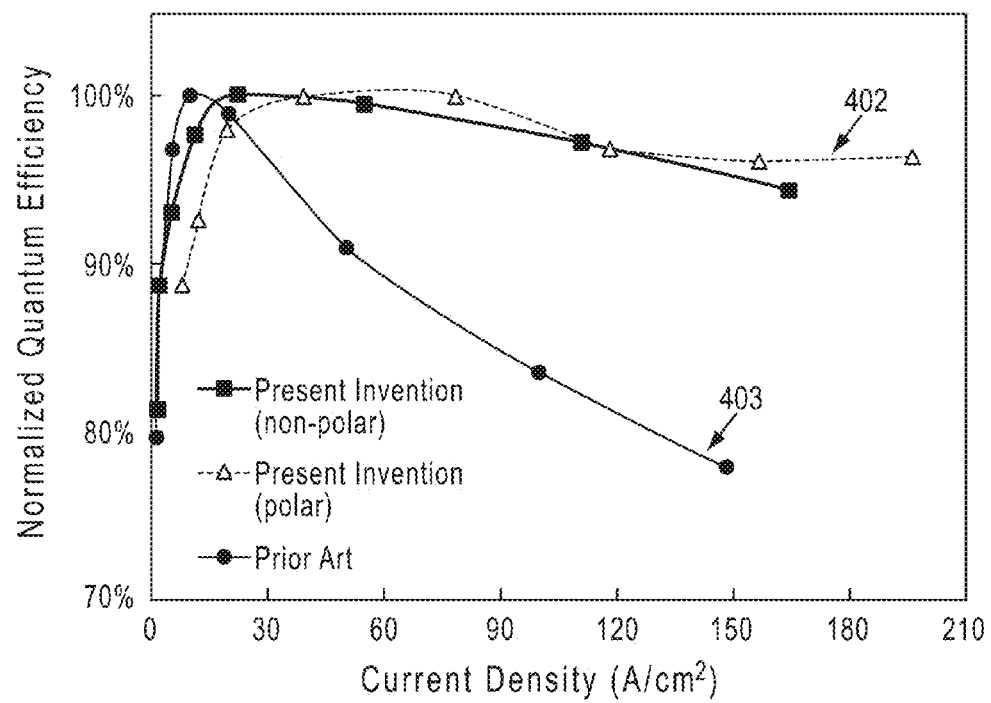
FIG. 4A illustrates quantum efficiency plotted against current density for LED devices according to an embodiment of the present invention and compared to prior art devices.

FIG. 4A illustrates quantum efficiency plotted against current density for LED devices according to an embodiment of the present invention. As shown, the present devices are substantially free from current droop and is within a tolerance of about 10 percent, which is significant. Further details of the present device can be found throughout the present specification and more particularly below. Line 403 represents the normalized quantum efficiency (%) with current density (A/cm$^2$) characteristic of prior art devices, and lines 402 represent the normalized quantum efficiency (%) with current density (A/cm$^2$) for non-polar and polar LEDs provided by the present disclosure.

Figure 5:
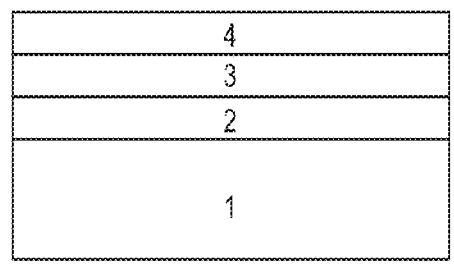
FIG. 5 is a simplified diagram of a high current density epitaxially grown LED structure according to an embodiment of the present invention.

FIG. 5 is a simplified diagram of a high current density epitaxially grown LED structure according to an embodiment of the present invention. In one or more embodiments, the LED structure includes at least:

1. A bulk GaN substrate, including a polar, semipolar or non-polar surface orientation. Further comprising details provided below.

Any orientation, e.g., polar, non-polar, semi-polar, c-plane.
   (Al,Ga,In)N based material
   Threading dislocation (TD) density <10$^8$ cm$^{-2}$
   Stacking fault (SF) density <10$^4$ cm$^{-1}$
   Doping >10$^{17}$ cm$^{-3}$ 2. An n-Type (Al)(In)GaN epitaxial layer(s) having a thickness ranging from about 1 nm to about 10 μm and a dopant concentration ranging from about 1×10$^{16}$ cm$^{-3}$ to about 5×10$^{20}$ cm$^{-3}$. Further comprising details provided below.

Thickness <2 μm, <1 μm, <0.5 μm, <0.2 μm
   (Al,Ga,In)N based material
   Growth T<1200° C., <1000° C.
   Un-intentionally doped (UID) or doped 3. A plurality of doped and/or undoped (Al)(In)GaN active region layers. Further comprising details provided below.

At least one (Al,Ga,In)N based layer
   Quantum Well (QW) structure with one or more wells
   QWs are >20 Å, >50 Å, >80 Å in thickness
   QW and n- and p-layer growth temperature identical, or similar
   Emission wavelength <575 nm, <500 nm, <450 nm, <410 nm 4. A p-Type (Al)(In)GaN epitaxial layer(s) having a thickness ranging from about 10 nm to about 500 nm and a dopant concentration ranging from about 1×10$^{16}$ cm$^{-3}$ to about 1×10$^{21}$ cm$^{-3}$. Further comprising details provided below.

At least one Mg doped layer
   Thickness <0.3 μm, <0.1 μm
   (Al,Ga,In)N based
   Growth T<1,100° C., <1,000° C., <900° C.
   At least one layer acts as an electron blocking layer
   At least one layer acts as a contact layer.

These structures are indicated in FIG. 5 as elements 1, 2, 3, and 4, respectively.

In a specific embodiment and referring to FIG. 5, the bulk GaN substrate is sliced from a gallium nitride boule, lapped, polished, and chemically mechanically polished according to methods that are known in the art. In some embodiments, the gallium nitride boule is grown epitaxially on a seed crystal. In some embodiments, the gallium nitride boule is grown ammonothermally. In other embodiments, the gallium nitride boule is grown by hydride vapor phase epitaxy (HVPE). Alternatively, combinations of these techniques can also exist. Polycrystalline gallium nitride source material may be formed by heating a crucible containing at least gallium in an atmosphere comprising at least one of ammonia, a hydrogen halide, and an inert gas such as argon. The crucible may further contain a getter material at a level of at least about 100 parts per million (ppm) with respect to the gallium. The getter may be selected from at least alkaline earth metals, scandium, titanium, vanadium, chromium, yttrium, zirconium, niobium, rare earth metals, hafnium, tantalum, and tungsten. The crucible may be placed within a reactor, heated to a temperature of at least about 400 degrees Celsius in an atmosphere comprising ammonia and a hydrogen halide for a period between about 30 minutes and about 72 hours, and cooled according to one or more embodiments. Further details of the process for synthesizing the polycrystalline indium gallium nitride are described in U.S. Publication No. 2010/0151194, which is incorporated by reference in its entirety. The resulting polycrystalline gallium nitride may have an oxygen content provided as a group III metal oxide or as a substitutional impurity within the gallium nitride that is less than about 10 parts per million (ppm), less than about 1 ppm, or less than about 0.1 ppm. Of course, there can be other variations, modifications, and alternatives.

At least one seed crystal may be provided for ammonothermal crystal growth according to a specific embodiment. In some embodiments the seed crystal is a gallium nitride single crystal. The seed crystal may have a wurtzite crystal structure. The seed crystal may have a dislocation density less than about 10$^8$ cm$^{-2}$, less than about 10$^7$ cm$^{-2}$, less than about 10$^6$ cm$^{-2}$, less than about 10$^5$ cm$^{-2}$, less than about 10$^4$ cm$^{-2}$, or less than about less than about 10$^3$ cm$^{-2}$. The large area faces of the seed crystal may comprise c-plane (0001) and/or (000-1), m-plane (10-10), a-plane (11-20), or a semipolar orientation such as {10-1-1} or {11-22} or, more generally, (hkil), as specified by the Bravais-Miller notation, where at least one of h and k is nonzero and l is also nonzero. The seed crystal may comprise a non-gallium nitride material such as sapphire, silicon carbide, spinel, or the like. The seed crystal may comprise at least one film of gallium nitride. The at least one gallium nitride film may be grown by metalorganic chemical vapor deposition (MOCVD), molecular beam epitaxy (MBE), hydride vapor phase epitaxy (HVPE), or liquid phase epitaxy (LPE). In some embodiments, both the front surface and the back surface of a heteroepitaxial seed material are coated by a film of gallium nitride, as described in U.S. Patent Application Ser. No. 61/096,304, which is hereby incorporated by reference in its entirety. In a preferred embodiment, the lattice constants of the large-area surfaces of the seed crystal are within 1%, 0.3%, 0.1%, 0.03%, 0.01%, 0.003%, or 0.001% of the lattice constants of the bulk gallium nitride crystal to be grown on the seed crystal. At least two seed crystals may be mounted on a seed rack, as described in U.S. Publication No. 2010/0031872, which is incorporated by reference in its entirety.

The polycrystalline gallium nitride and at least one seed crystal may be provided to an autoclave or a capsule for placement within an internally heated high pressure apparatus. Examples of suitable high pressure apparatus are described in U.S. Publication Nos. 2009/0301387, 2009/0301388, 2009/0320744, and 2010/0031875, each of which is incorporated by reference in its entirety. A mineralizer is also provided to the autoclave or capsule. The mineralizer may comprise a base, such as at least one of an alkali metal, an alkali amide, an alkali imide, an alkali amido-imide, an alkali azide, an alkali nitride, an alkaline earth metal, an alkaline earth amide, an alkaline earth azide, or an alkaline earth nitride. The mineralizer may comprise an acid, such as at least one of an ammonium halide, a hydrogen halide, gallium halide, or a compound that may be formed by reaction of two or more of gallium metal, indium metal, ammonia, and a hydrogen halide. In some embodiments the mineralizer comprises two or more metal constituents, two or more halogen constituents, and/or two or more compounds. Ammonia may also be provided, at a percent fill between about 50% and about 98%, or between about 60% and about 90%, and the capsule or autoclave sealed. The capsule or autoclave may be heated to a temperature of at least about 400 degrees Celsius and a pressure of at least about 100 megapascal (MPa) in order to cause crystal growth upon at least one seed crystal. Additional details of the crystal growth process may be found in U.S. Patent Application Publication No. 2008/0087919.

The ammonothermally-grown crystalline group III metal nitride may be characterized by a wurzite structure substantially free from any cubic entities and have an optical absorption coefficient of about 3 cm$^{-1}$ and less at wavelengths between about 385 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure, an impurity concentration greater than $10^{14}$ cm$^{-1}$, greater than $10^{15}$ cm$^{-1}$, or greater than $10^{16}$ cm$^{-1}$ of at least one of Li, Na, K, Rb, Cs, Mg, Ca, F, and Cl, and an optical absorption coefficient of about 2 cm$^{-1}$ and less at wavelengths between about 385 nanometers and about 750 nanometers. The gallium nitride crystal may have an optical absorption coefficient of about 0.5 cm$^{-1}$ and less at wavelengths between about 385 nanometers and about 750 nanometers. The ammonothermally-grown gallium nitride crystal may be an n-type semiconductor, with a carrier concentration n between about $10^{16}$ cm$^{-3}$ and $10^{20}$ cm$^{-3}$ and a carrier mobility $\eta$, in units of centimeters squared per volt-second, such that the logarithm to the base 10 of $\eta$ is greater than about $=-0.018557n^3+1.0671n^2-20.599n+135.49$. The ammonothermally-grown gallium nitride crystal may have a resistivity less than about 0.050 Ω-cm, less than about 0.025 Ω-cm, or less than about 0.010 Ω-cm. The ammonothermally-grown gallium nitride crystal may be a p-type semiconductor, with a carrier concentration n between about $10^{16}$ cm$^{-3}$ and $10^{20}$ cm$^{-3}$ and a carrier mobility in units of centimeters squared per volt-second, such that the logarithm to the base 10 of $\eta$ is greater than about $-0.6546n+12.809$. In certain embodiments, the resistivity is less than In another specific embodiment, the bulk GaN substrate is prepared from a boule that was grown by a flux method. Examples of suitable flux methods are described in U.S. Pat. No. 7,063,741 and in U.S. Patent Application Publication 2006/0037529, each of which are hereby incorporated by reference in their entirety. A polycrystalline group III metal nitride and at least one flux are placed in a crucible and inserted into a furnace. The furnace is heated and the polycrystalline group III metal nitride is processed in a molten flux at a temperature greater than about 400 degrees Celsius and a pressure greater than about one atmosphere, during which at least a portion of the polycrystalline group III metal nitride is etched away and recrystallized onto at least one group III nitride crystal. In yet another specific embodiment, the bulk GaN substrate is prepared from a boule that was grown by hydride vapor phase epitaxy (HVPE). Further details of the next steps including growth sequences are explained throughout the present specification and more particularly below.

In a specific embodiment, the growth sequence includes deposition of at least (1) n-type epitaxial material; (2) active region; (3) electron blocking region; and (4) p-type epitaxial material. Of course, there can be other variations, modifications, and alternatives. Again, further details of the present method can be found throughout the present specification and more particularly below.

In certain embodiments, epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3,000 and about 12,000. In certain embodiments, a contact layer of n-type (silicon-doped) GaN is deposited on the substrate, with a thickness of less than 5 microns and a doping level of about $2\times10^{18}$ cm$^{-3}$.

In certain embodiments, an undoped InGaN/GaN multiple quantum well (MQW) is deposited as the active layer. The MQW active region has two to twenty periods, comprising alternating layers of 2 nm to 12 nm of InGaN and 1 nm to 20 nm of GaN as the barrier layers. Next, a 5 nm to 30 nm undoped AlGaN electron blocking layer is deposited on top of the active region. In other embodiments, the multiple quantum wells can be configured slightly differently. The substrate and resulting epitaxial surface orientation may be polar, nonpolar or semipolar. In one or more other embodiments, the bulk wafer can be in an off-axis configuration, which causes formation of one or more smooth films. In certain embodiments, the overlying epitaxial film and structures are characterized by a morphology that is smooth and relatively free-from pyramidal hillocks. Further details of the off-axis configuration and surface morphology can be found throughout the present specification and more particularly below. As an example, however, details of the off cut embodiment is described in "Method and Surface Morphology of Non-Polar Gallium Nitride Containing Substrates," James Raring et al., U.S. application Ser. No. 12/497,289 filed on Jul. 2, 2009, which is incorporated by reference in its entirety.

A method according to embodiments for forming a smooth epitaxial film using an offcut or miscut or off-axis substrate is outlined below.

1. Provide a GaN substrate or boule;
2. Perform off-axis miscut of GaN substrate to expose desired surface region or process substrate or boule (e.g., mechanical process) to expose off-axis oriented surface region;
3. Transfer GaN substrate into MOCVD process chamber;
4. Provide a carrier gas selected from nitrogen gas, hydrogen gas, or a mixture of thereof;
5. Provide a nitrogen bearing species such as ammonia or the like;
6. Raise MOCVD process chamber to growth temperature, e.g., 700 to 1200 Degrees Celsius;
7. Maintain the growth temperature within a predetermined range;
8. Combine the carrier gas and nitrogen bearing species such as ammonia with group III precursors such as the indium precursor species tri-methyl-indium and/or tri-ethyl-indium, the gallium precursor species tri-methyl-gallium and/or tri-ethyl-gallium, and/or the aluminum precursor tri-methyl-aluminum into the chamber;
9. Form an epitaxial film containing one or more of the following layers GaN, InGaN, AlGaN, and InAlGaN;
10. Cause formation of a surface region of the epitaxial gallium nitride film substantially free from hillocks and other surface roughness structures and/or features;
11. Repeat steps (9) and (10) for other epitaxial films to form one or more device structures; and
12. Perform other desired processing steps.

In one specific embodiment, for nonpolar orientation (10-10), the miscut substrate in step 2 has a surface orientation that is tilted by about 0.1 degree from (10-10) toward (0001). In another specific embodiment, the miscut substrate in step 2 has a surface orientation that is tilted by between about 0.1 degree and about 0.5 degree from (10-10) toward (0001). In still another specific embodiment, the miscut substrate in step 2 has a surface orientation that is tilted by between about 0.2 degree and about 1 degree from (10-10) toward (0001). In yet another specific embodiment, the miscut substrate in step 2 has a surface orientation that is tilted by between about 1 degree and about 3 degrees from (10-10) toward (0001).

In another specific embodiment, the miscut substrate in step 2 has a surface orientation that is tilted by about 0.1 degree from (10-10) toward (1-210). In another specific embodiment, the miscut substrate in step 2 has a surface orientation that is tilted by between about 0.1 degree and about 0.5 degree from (10-10) toward (1-210). In still another specific embodiment, the miscut substrate in step 2 has a surface orientation that is tilted by between about 0.2 degree and about 1 degree from (10-10) toward (1-210). In yet another specific embodiment, the miscut substrate in step 2 has a surface orientation that is tilted by between about 1 degree and about 3 degrees from (10-10) toward (1-210).

The above sequence of steps provides a method according to certain embodiments of the present invention. In a specific embodiment, the present invention provides a method and resulting crystalline epitaxial material with a surface region that is substantially smooth and free from hillocks and the like for improved device performance. Although the above has been described in terms of an off-axis surface configuration, there can be other embodiments having an on-axis configuration using one or more selected process recipes, which have been described in more detail throughout the present specification and more particularly below. Other alternatives can also be provided where steps are added, one or more steps are removed, or one or more steps are provided in a different sequence without departing from the scope of the claims herein.

As an example, the present method can use the following sequence of steps in forming one or more of the epitaxial growth regions using an MOCVD tool operable at atmospheric pressure, or low pressure, in some embodiments.

1. Start;
2. Provide a crystalline substrate member comprising a backside region and a surface region, which has been offcut or miscut or off-axis;
3. Load substrate member into an MOCVD chamber;
4. Place substrate member on susceptor, which is provided in the chamber, to expose the offcut or miscut or off axis surface region of the substrate member;
5. Subject the surface region to a first flow (e.g., derived from one or more precursor gases including at least an ammonia containing species, a Group III species, and a first carrier gas) in a first direction substantially parallel to the surface region;
6. Form a first boundary layer within a vicinity of the surface region;
7. Provide a second flow (e.g., derived from at least a second carrier gas) in a second direction configured to cause change in the first boundary layer to a second boundary layer;
8. Increase a growth rate of crystalline material formed overlying the surface region of the crystalline substrate member;
9. Continue crystalline material growth to be substantially free from hillocks and/or other imperfections;
10. Cease flow of precursor gases to stop crystalline growth;
11. Perform other steps and repetition of the above, as desired; and
12. Stop.

The above sequence of steps provides methods according to an embodiment of the present invention. As shown, the method uses a combination of steps including a way of forming a film of crystalline material using MOCVD. In preferred embodiments, the present invention includes atmospheric pressure (e.g. 700 Torr to 800 Torr) growth for formation of high quality gallium nitride containing crystalline films that are smooth and substantially free from hillocks, pyramidal hillocks, and other imperfections that lead to degradation of the electrical or optical performance of the device, including droop. In some embodiments, a multiflow technique is provided.

Figure 5A:
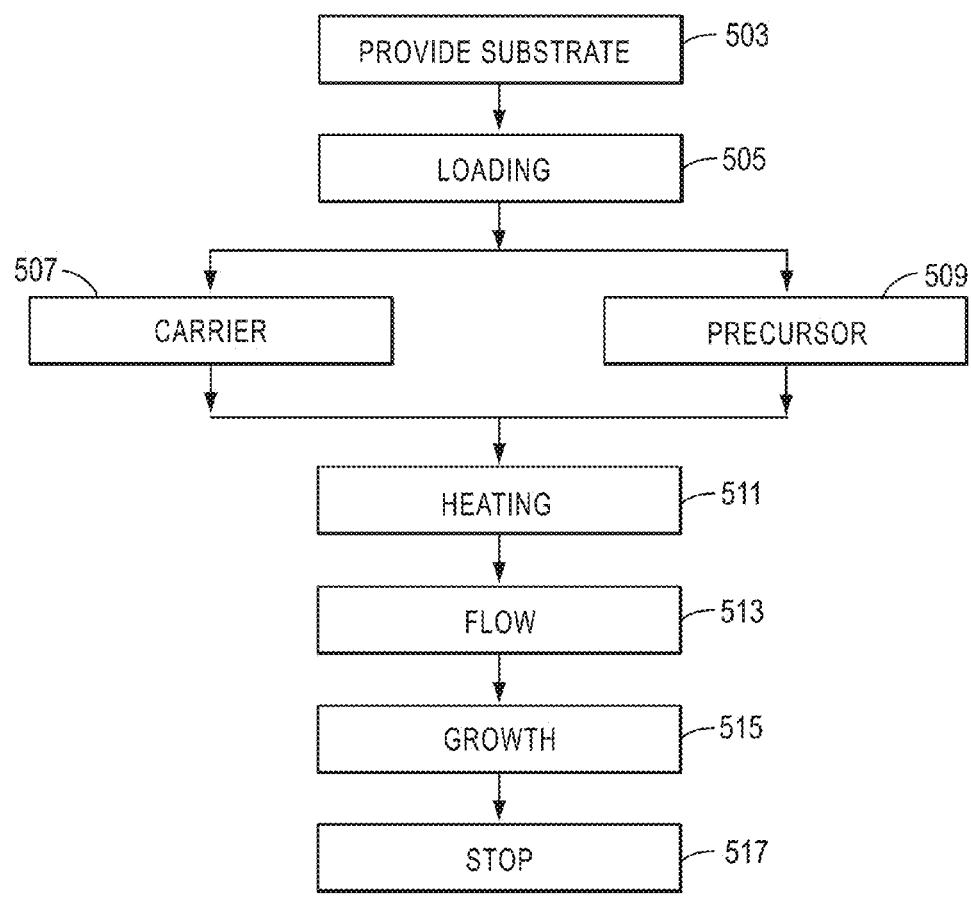
FIG. 5A is a simplified flow diagram of an epitaxial deposition process according to one or more embodiments of the present invention.

FIG. 5A is one example of a simplified flow diagram for a method for fabricating an improved GaN film according to an embodiment of the present invention. The invention provides (step 503) a crystalline substrate member having a backside region and a surface region. The crystalline substrate member can include a gallium nitride wafer, or the like. In a preferred embodiment, the substrate is bulk nonpolar (10-10) GaN substrate.

In a specific embodiment, the present method uses a miscut or offcut crystalline substrate member or boule of GaN, but can be other materials and does not imply use of a process of achieving the miscut or offcut. As used herein, the term "miscut" should be interpreted according to ordinary meaning as understood by one of ordinary skill in the art. The term miscut is not intended to imply any undesirable cut relative to, for example, any of the crystal planes, e.g., c-plane, a-plane. The term miscut is intended to describe a surface orientation slightly tilted with respect to, or vicinal to, a low-Miller-index surface crystal plane such as the nonpolar (10-10) GaN plane. In other embodiments, the miscut surface orientation is vicinal to a semipolar orientation such as the (10-1-1) family of planes, the (11-22) family of planes, the {20-21} family of planes or the {30-31} family of planes, but there can be others. Additionally, the term "offcut" is intended to have a similar meaning as miscut, although there could be other variations, modifications, and alternatives. In yet other embodiments, the crystalline surface plane is not miscut and/or offcut but can be configured using a mechanical and/or chemical and/or physical process to expose any one of the crystalline surfaces described explicitly and/or implicitly herein. In specific embodiments, the term miscut and/or offcut and/or off axis is characterized by at least one or more directions and corresponding magnitudes, although there can be other variations, modifications, and alternatives.

As shown, the method includes placing or loading (step 505) the substrate member into an MOCVD chamber. In a specific embodiment, the method supplies one or more carrier gases, step 507, and one or more nitrogen bearing precursor gases, step 509, which are described in more detail below. In one or more embodiments, the crystalline substrate member is provided on a susceptor from the backside to expose the surface region of the substrate member. The susceptor is preferably heated using resistive elements or other suitable techniques. In a specific embodiment, the susceptor is heated (step 511) to a growth temperature ranging from about 700 to about 1,200 Degrees Celsius, but can be others.

In a specific embodiment, the present method includes subjecting the surface region of the crystalline substrate to a first flow in a first direction substantially parallel to the surface region. In a specific embodiment, the method forms a first boundary layer within a vicinity of the surface region. In a specific embodiment, the first boundary layer is believed to have a thickness ranging from about 1 millimeters to about 1 centimeters, but can be others. Further details of the present method can be found below.

Depending upon the embodiment, a flow is preferably derived from one or more precursor gases including at least an ammonia containing species, a Group III species (step 513), and a first carrier gas, and possibly other entities. Ammonia is a Group V precursor according to a specific embodiment. Other Group V precursors include $N_2$. In a specific embodiment, the first carrier gas can include hydrogen gas, nitrogen gas, argon gas, or other inert species, including combinations. In a specific embodiment, the Group III precursors include TMGa, TEGa, TMIn, TMAl, dopants (e.g., $Cp_2Mg$, disilane, silane, diethelyl zinc, iron, manganese, or cobalt containing precursors), and other species. As an example, a preferred combination of miscut/offcut/substrate surface configurations, precursors, and carrier gases are provided below.

Non-polar (10-10) GaN substrate surface configured −0.6 degrees and greater or preferably −0.8 degrees and greater (and less than −1.2 degrees) in magnitude toward c-plane (0001);

Carrier Gas: Any mixture of $N_2$ and $H_2$, but preferably all $H_2$;

Group V Precursor: $NH_3$; Group III Precursor: TMGa and/or TEGa and/or TMIn and/or TEIn and/or TMAl; and Optional Dopant Precursor: Disilane, silane, $Cp_2Mg$; or Non-polar GaN substrate with no offcut or miscut;

Carrier Gas: all $N_2$; Group V Precursor: $NH_3$; Group III Precursor: TMGa and/or TEGa and/or TMIn and/or TEIn and/or TMAl; and Optional Dopant Precursor: Disilane, silane, $Cp_2Mg$.

Depending upon the embodiment, the method also continues (step 515) with epitaxial crystalline material growth, which is substantially smooth and substantially free of hillocks or other imperfections. In a specific embodiment, the method also can cease flow of precursor gases to stop growth and/or perform other steps. In a specific embodiment, the method stops at step 517. In a preferred embodiment, the present method causes formation of a gallium nitride containing crystalline material that has a surface region that is substantially free of hillocks and other defects, which lead to poorer crystal quality and can be detrimental to device performance. In a specific embodiment, at least 90% of the surface area of the crystalline material is free from pyramidal hillock structures.

The above sequence of steps provides methods according to certain embodiments of the present invention. As shown, the method uses a combination of steps including a way of forming a film of crystalline material using MOCVD. In preferred embodiments, the present invention includes a flow technique provided at atmospheric pressure for formation of high quality gallium nitride containing crystalline films, which have surface regions substantially smooth and free from hillocks and other defects or imperfections. The above sequence of steps provides a method according to an embodiment of the present invention. In a specific embodiment, the resulting crystalline material is substantially free from hillocks for improved device performance.

In one or more embodiments, a p-type GaN contact layer is deposited, with a thickness of about 200 nm and a hole concentration greater than about $5 \times 10^{17}$ cm$^{-3}$. An ohmic contact layer is deposited onto the p-type contact layer as the p-type contact and may be annealed to provide desired characteristics. Ohmic contact layers include Ag-based single or multi-layer contacts, indium-tin-oxide (ITO) based contacts, Pd based contacts, Au based contacts, and others. LED mesas, with a size of about 250×250 µm², are formed by photolithography and dry etching using a chlorine-based inductively-coupled plasma (ICP) technique. As an example, Ti/Al/Ni/Au is e-beam evaporated onto the exposed n-GaN layer to form the n-type contact. Ti/Au may be e-beam evaporated onto a portion of the p-type contact layer to form a p-contact pad, and the wafer is diced into discrete LED dies using techniques such as laser scribe and break, diamond scribe and break, sawing, water-jet cutting, laser ablation, or others. Electrical connections are formed by conventional die-attach and wire bonding steps.

Figure 6:
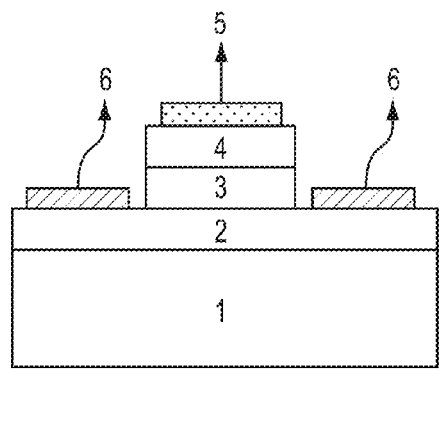
FIG. 6 is a simplified diagram illustrating a high current density LED structure with electrical connections according to an embodiment of the present invention.

FIG. 6 is a simplified diagram illustrating a high current density LED structure with electrical connections according to an embodiment of the present invention. As shown, the LED structure is characterized as a top-emitting lateral conducting high current density LED according to a specific embodiment. Preferably, the LED structure includes at least:

1. A bulk GaN substrate, including polar, semipolar or non-polar surface orientation;

2. An n-Type (Al)(In)GaN epitaxial layer(s) having a thickness ranging from about 1 nm to about 10 µm and a dopant concentration ranging from about $1 \times 10^{16}$ cm$^{-3}$ to about $5 \times 10^{20}$ cm$^{-3}$;

3. A plurality of doped and/or undoped (Al)(In)GaN Active Region layers;

4. A p-Type (Al)(In)GaN epitaxial layer(s) having a thickness ranging from about 10 nm to about 500 nm and a dopant concentration ranging from about $1\times10^{16}$ cm$^{-3}$ to about $1\times10^{21}$ cm$^{-3}$;

5. A semi-transparent p-type contact made of a suitable material such as indium tin oxide, zinc oxide and having a thickness ranging from about 5 nm to about 500 nm; and 6. An n-type contact made of a suitable material such as Ti/Al/Ni/Au or combinations of these metals, Ti/Al/Ti/Au or combinations of these metals having a thickness ranging from about 100 nm to about 7 μm.

The structures are identified in FIG. 6 as elements 1, 2, 3, 4, 5, and 6, respectively.

Figure 7:
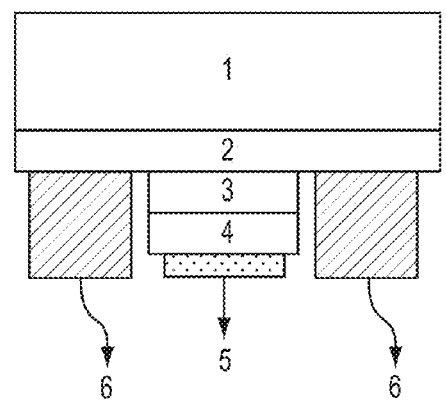
FIG. 7 is a simplified diagram of a bottom-emitting lateral conducting high current density LED device according to an embodiment of the present invention.

FIG. 7 is a simplified diagram of a substrate-emitting lateral conducting (i.e., "flip-chip") high current density LED device according to an embodiment of the present invention. In this embodiment, the LED device includes at least:

1. A bulk GaN substrate;
2. An n-Type (Al)(In)GaN epitaxial layer(s);
3. A plurality of doped and/or undoped (Al)(In)GaN Active Region layers;
4. A p-Type (Al)(In)GaN epitaxial layer(s);
5. A reflective p-type contact; and
6. An n-type contact.

The structures are identified in FIG. 7 as elements 1, 2, 3, 4, 5, and 6, respectively.

Figure 8:
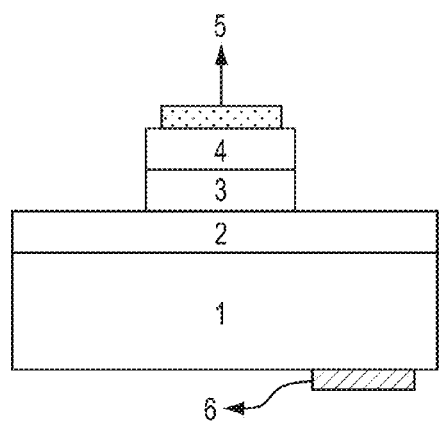
FIG. 8 is a simplified diagram of a bottom-emitting vertically conducting high current density LED according to a specific embodiment of the present invention.

FIG. 8 is a simplified diagram of a substrate-emitting vertically conducting high current density LED according to a specific embodiment of the present invention. The LED device includes at least:

1. A bulk GaN substrate;
2. An n-Type (Al)(In)GaN epitaxial layer(s);
3. A plurality of doped and/or undoped (Al)(In)GaN Active Region layers;
4. A p-Type (Al)(In)GaN epitaxial layer(s);
5. A reflective p-type contact; and
6. An n-type contact.

The structures are identified in FIG. 8 as elements 1, 2, 3, 4, 5, and 6, respectively.

Figure 9:
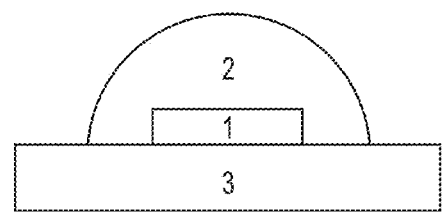
FIG. 9 is a simplified example of a packaged white LED containing a high current density LED device according to an embodiment of the present invention.

FIG. 9 is a simplified example of a packaged white light LED containing a high current density LED device according to an embodiment of the present invention. In a specific embodiment, the packaged LED device includes at least:

1. A high current density LED device;
2. An encapsulant or lens material that may or may not contain a combination of red, green, blue, orange, yellow emitting, and/or other color down-conversion materials in a configuration such that white light is produced when the down-conversion materials are contained in the encapsulant or lens; and
3. An LED package that provides electrical connection to the LED and a path for thermal dissipation from the subject invention to the surrounding environment.

The structures are identified in FIG. 9 as elements 1, 2, and 3, respectively.

Other examples of packaged LED devices can be found in U.S. Publication No. 2011/0186887, which is incorporated by reference in its entirety. In other embodiments, the packaged device includes an array configuration such as described in U.S. Publication No. 2011/0186874, which is incorporated by reference in its entirety. The present LED devices can be configured in an array formed on a substrate member.

Figure 10:
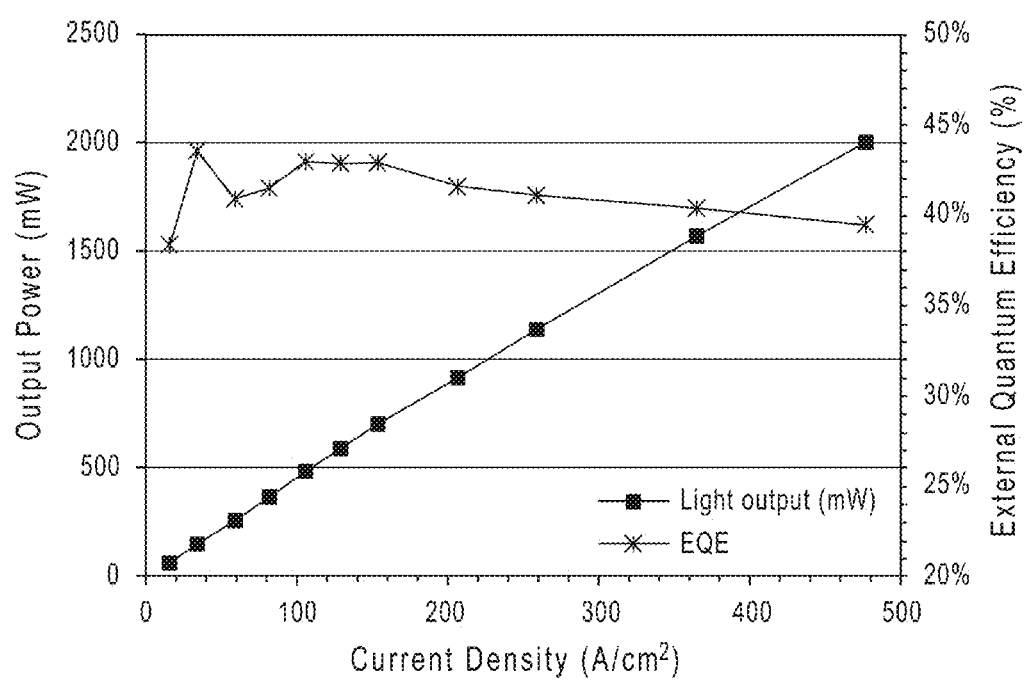
FIG. 10 is a simplified diagram showing pulsed output power vs. current density and external quantum efficiency vs. current density for an LED fabricated on nonpolar GaN with an emission wavelength of about 405 nm according to one or more embodiments.

FIG. 10 is a simplified diagram showing pulsed output power (mW) vs. current density (A/cm$^2$) and external quantum efficiency vs. current density for an LED fabricated on nonpolar GaN with an emission wavelength of about 405 nm according to one or more embodiments. Of particular mention is the small decrease in external quantum efficiency up to approximately four times higher operating current density than for conventional LEDs that have been fabricated in the prior art. Other examples were provided in FIG. 4A.

In certain embodiments, the device uses an Indium Tin Oxide (ITO) as a contact material configured for operation at high current density. In certain embodiments, the high current density is 200 Amps/cm$^2$, for example as high as 500 Amps/cm$^2$, or even 1,000 Amps/cm$^2$ and greater. The ITO material is substantially free from degradation, and free from imperfections.

The junction temperature of the LED under operating conditions is greater than about 100 degrees Celsius, and often greater than about 150 degrees Celsius, or even above about 200 degrees Celsius. In some embodiments, the LED is able to operate in continuous wave (CW) mode without active cooling, and in some cases without passive cooling.

In other embodiments, the present invention provides a resulting device and method using bulk gallium and nitrogen containing material for improved reliability. That is, growth on the bulk GaN substrates increases reliability at the high current densities. In contrast, conventional LEDs grown on foreign substrates are imperfect and include multiple defects. It is believed that such defects caused by the heteroepitaxial growth limit the device lifetime and therefore prohibit operation at high current densities. The LEDs according to one or more embodiments should not suffer from the same defects. In certain embodiments, the lifetime windows are >500 hours CW, >1,000 hours CW, >2,000 hours CW, >5,000 hrs CW, or others.

In a specific embodiment, the present invention can also include LED based lighting fixtures and replacement lamps. As an example, goals of these lighting fixtures are to produce an acceptable level of light (total lumens), of a desirable appearance (color temperature and CRI), with a high efficacy (lm/W), at a low cost. While these characteristics are all desirable, there are typically design tradeoffs that must be considered that result in some, but not all, of the requirements being met. In the present invention, we propose LED based fixtures and lamps that are based on light emitting diodes grown on bulk III-Nitride substrates such as a bulk gallium nitride substrate. These LEDs exhibit surprisingly superior performance characteristics compared with conventional LEDs that are grown heteroepitaxially on foreign substrates such as sapphire, silicon carbide, silicon, zinc oxide, and the like. The characteristics that these bulk III-nitride based LEDs exhibit enable very different lamp/fixture designs that are currently were believed not to be possible with conventional LEDs.

Conventional light sources, incandescent, halogen, fluorescent, HID, and the like have well-defined standard characteristics. This standardization allows for a high degree of knowledge on the operating characteristics that are required from LED based lamps when designing light sources that are made to be replacements for the incumbent technology. While there is a vast array of lighting products on the market, there are a large number of standard lamps or fixtures that have been the subject of intense research for LED based replacement solutions. Some examples of these lamp/fixtures, while not exhaustive, include A-lamps, fluorescent tubes, compact CFL's, metallic reflectors of various sizes (MR), parabolic reflectors of various sizes (PAR), reflector bulbs (R), single and double ended quartz halogens, candelabra's, globe bulbs, high bays, troffers, and cobraheads. A given lamp will have characteristic luminous outputs that are dictated by the input power to the lamp. For example, a 20 W MR-16 fixture will typically emit approximately 300 lm, a 30 W MR-16, 450 lm, and a 50 W MR-16 will emit 700 lm. To appropriately replace these fixtures with an LED solution, the lamp must conform to the geometrical sizing for MR16 lamps, and reach minimum levels of luminous flux.

Despite these specified guidelines, there are relatively few true replacement lamps that are designed with LEDs that reach the luminous flux desired and have either a comparable or higher luminous efficacy, motivating the end user to switch from the incumbent technology. Those products that do meet these requirements are prohibitively expensive which has led to extremely slow adoption. A large portion of this cost is dictated by the number of LEDs required for LED based lamps to reach the luminous flux and luminous efficacy of current technology. This has occurred despite the high luminous efficacy that is typically reported for LEDs, which is much lower in an SSL lamp than specified as a discrete device.

Figure 11:
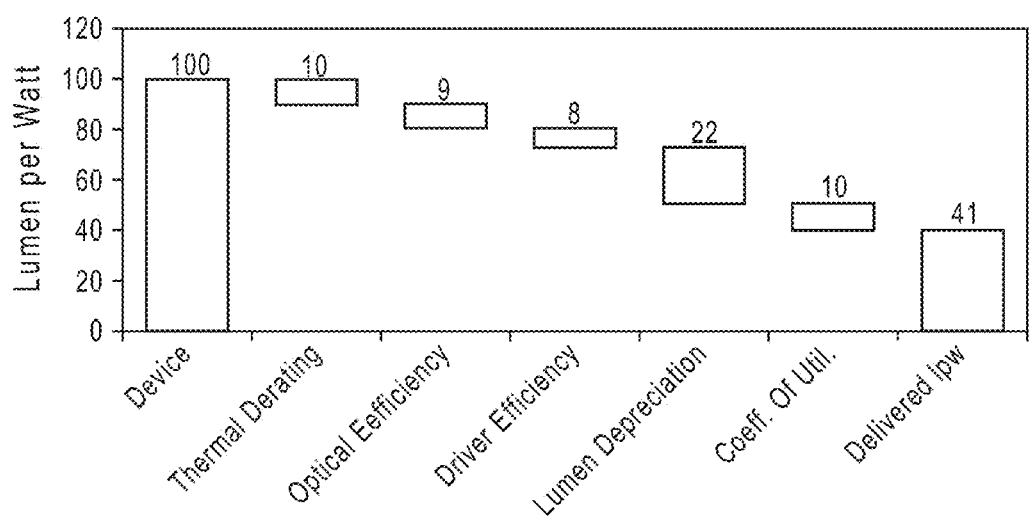
FIG. 11 shows a typical derating that is performed for LEDs that are inserted into an SSL lamp.

FIG. 11 shows a LED de-rating that SSL users assume when using LEDs in a SSL application. See Challenges for LEDs in Commercial Lighting, LEDs 2009, San Diego, Calif., October 2009. The LEDs typically have to be de-rated from their specified performance to account for increased temperature during operation, optical loss, electrical conversion losses, and lumen depreciation over time. Reduced efficacy and total flux as a function of temperature is extremely problematic because heating results both from the minimal heat sink volume in typical lamp fixtures, and additional heating that occurs as the end user increases the input current in an attempt to increase the output flux. As shown in FIG. 11, after account for a derating due to thermal effects, optical efficiency, driver efficiency, lumen depreciation, and coefficient of utility, a LED having a rating of 100 lumen/Watt can be derated to a delivered output of only 41 lumen/Watt.

Figure 12:
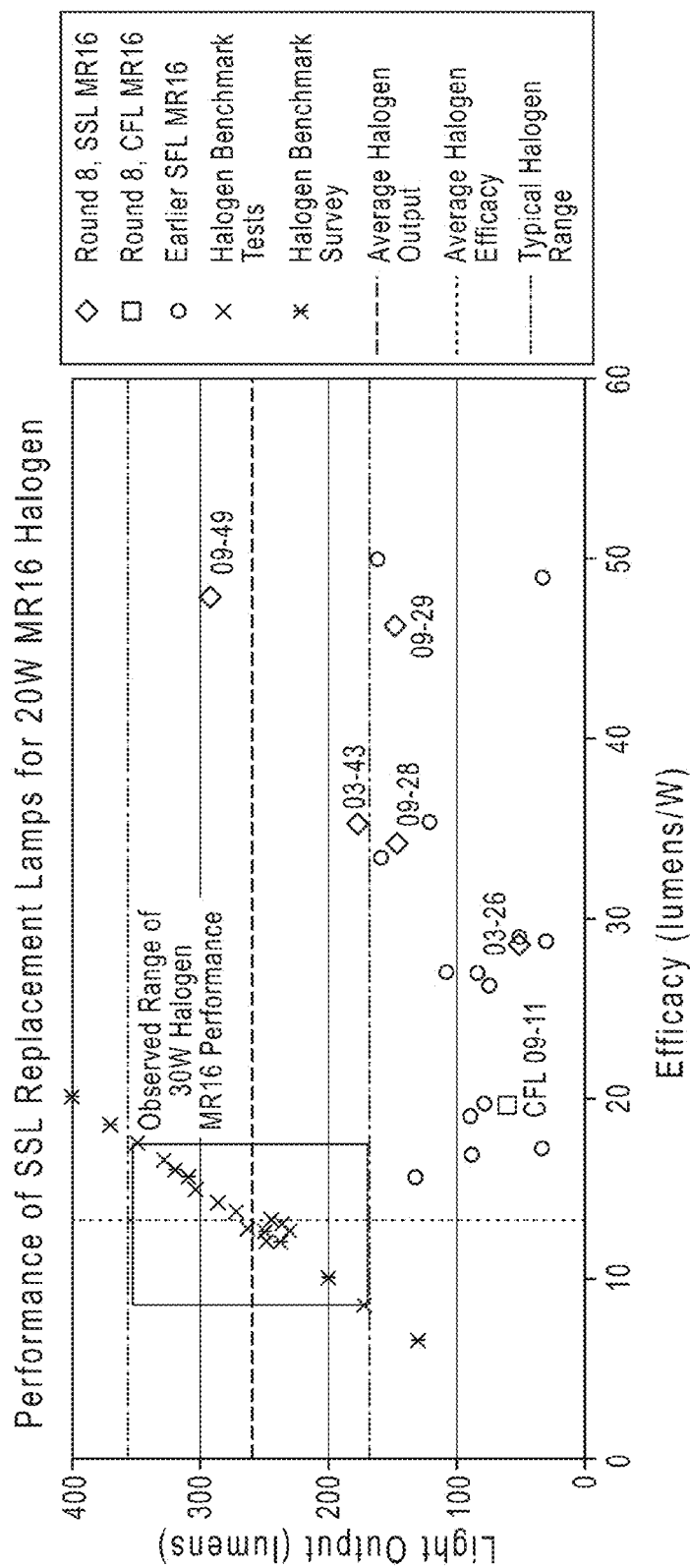
FIG. 12 is a chart of light output vs. efficacy of the performance of SSL replacement lamps for 20 W MR16 halogen.
Figure 13:
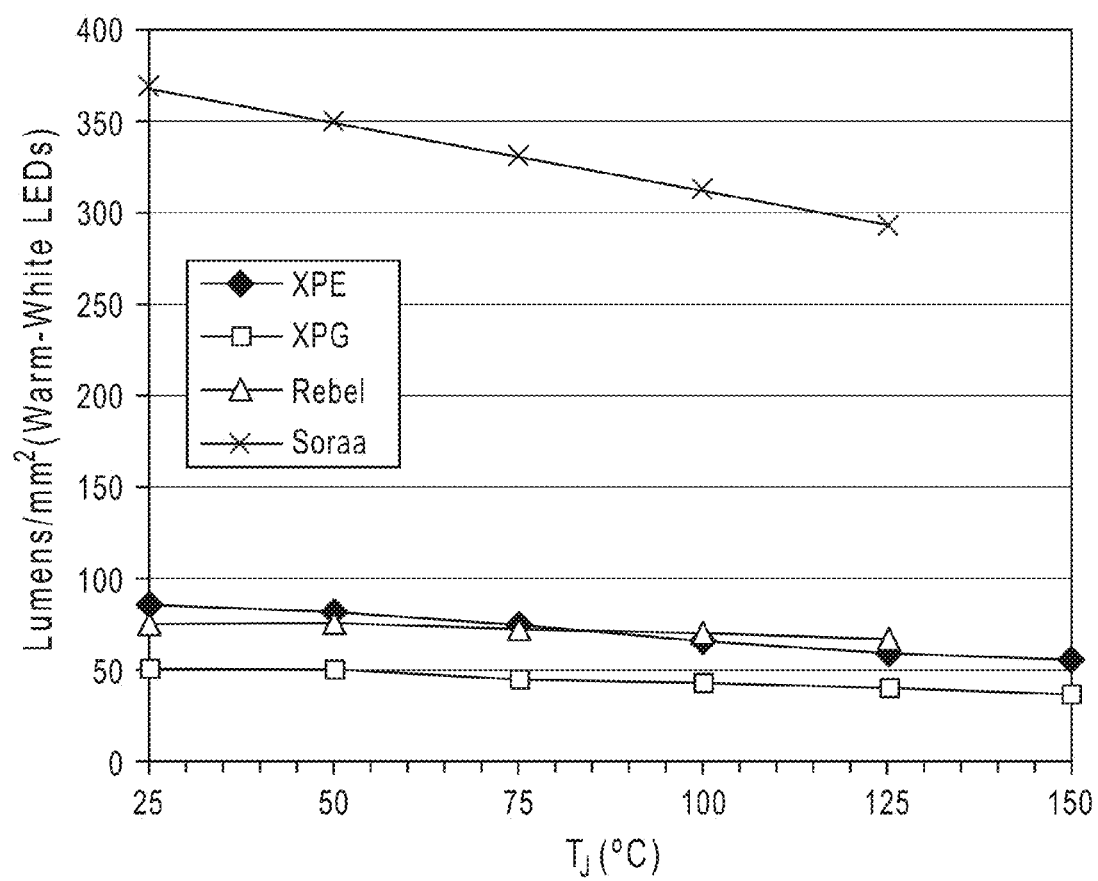
FIG. 13 is a summary of lumen/mm$^2$ for conventional LEDs compared to certain embodiments of the present disclosure at 350 mA drive current.
Figure 14:
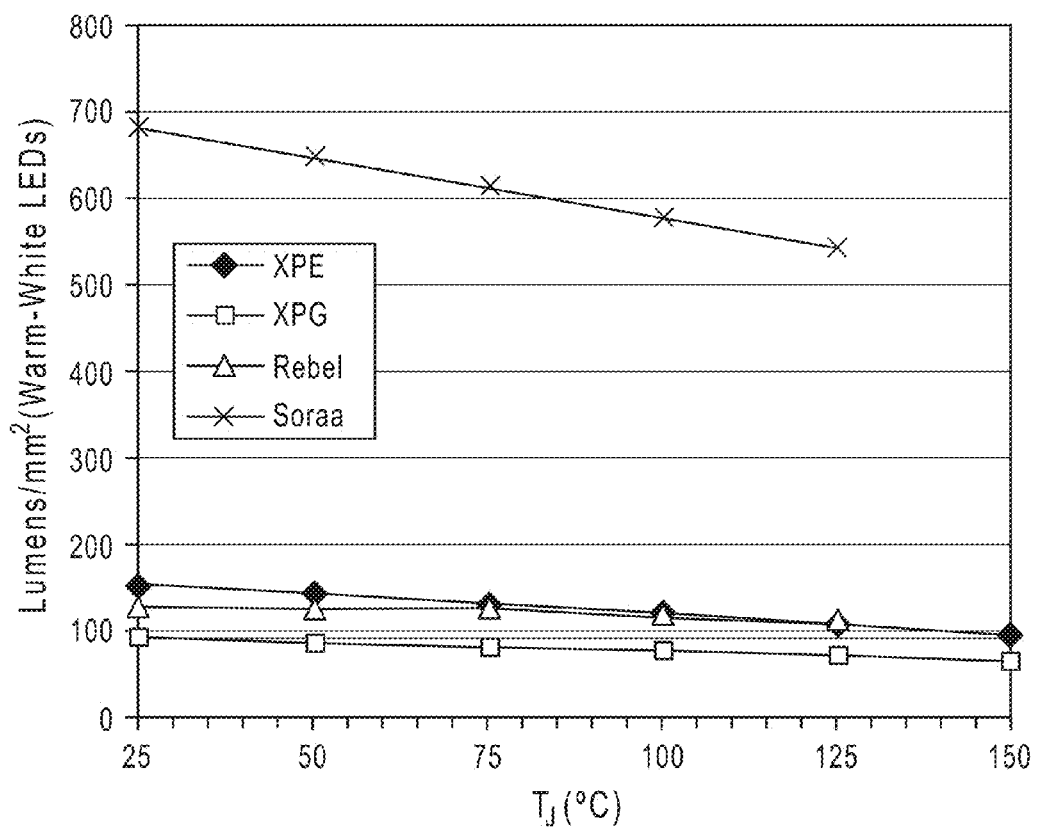
FIG. 14 is a summary of lumen/mm$^2$ for conventional LEDs compared to certain embodiments of the present disclosure at 700 mA drive current.
Figure 15:
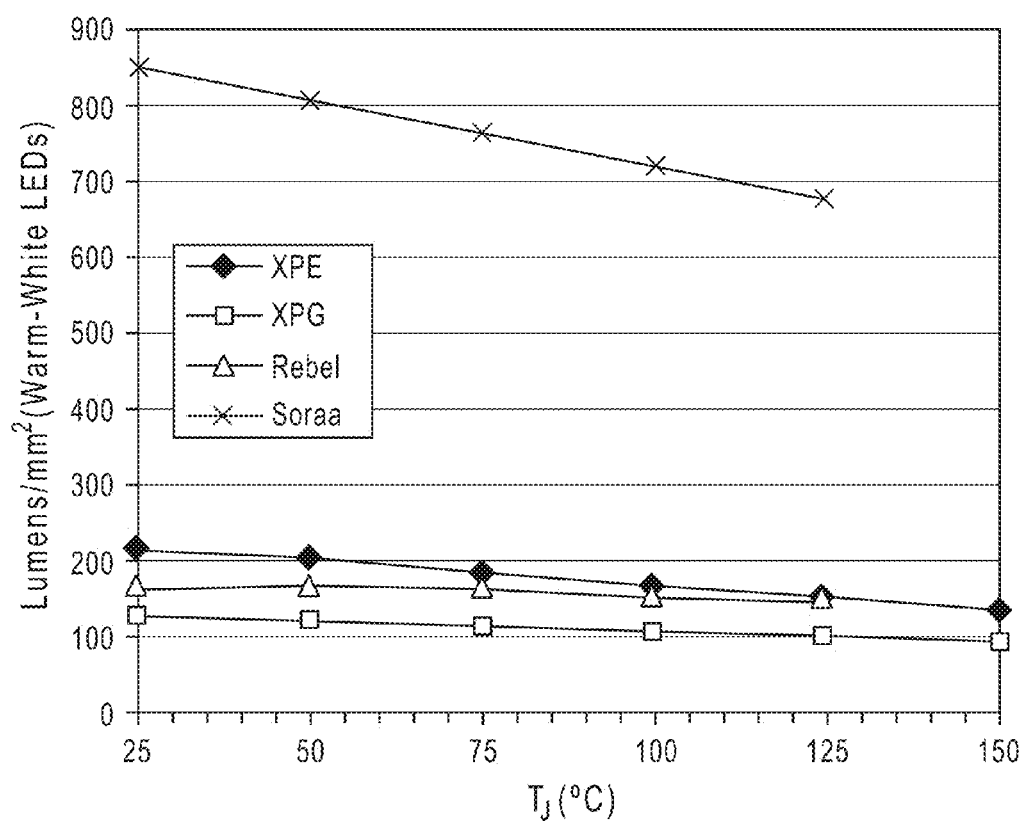
FIG. 15 is a summary of lumen/mm$^2$ for conventional LEDs compared to certain embodiments of the present disclosure at 1,000 mA drive current.

As an example of the performance limitations of current LED based lamps, FIG. 12 shows cumulative data that was measured as part of the U.S. Department of Energy Caliper Testing program on MR16 light lamps. FIG. 12 shows that to replicate the output power of a 20 W halogen bulb, the LED equivalent must generate at least 270 lumens of flux with a luminous efficacy in excess of 13 lm/W. While even with de-rating, the results show that most products exceed the luminous efficacy of the halogen incumbent, only one product generated enough total flux to claim equivalence to a 20 W MR16. In addition, this product achieved this flux by mounting a large number (>4) of high power LEDs into the MR16 fixture, resulting in a fixture with greater than 4 mm$^2$ of LED junction active area. The cost of the lamp increases approximately linearly as the total junction active area for the LEDs increases. Thus, it is highly desirable to decrease the total active junction area of LED that is contained within a given lamp, while still maintaining the desired total flux and efficacy.

Typical LEDs that are grown heteroepitaxially are unable to maintain high flux while decreasing the active area size because of current and thermal "droop". As the current density is increased in an LED, the relative efficiency has been shown to decrease. This effect can result in a decrease in relative radiative efficiency from 100% at about 10 A/cm$^2$ to 50% at about 100 A/cm$^2$.

LED radiative efficiency has also been shown to decrease as a function of the temperature of the junction of the LED. As the LED junction area decreases, the thermal resistance of the LED to package bond increases because the area for thermal flow is decreased. In addition to this, the current density increase that is associated with the decreasing area results in lower radiative efficiency as described above and thus more power that is required to be dissipated as heat. Further details of performance characteristics of conventional LED devices as compared to the present techniques are provided below. As shown, the present techniques and device lead to higher lumens per square area.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80 degrees to 100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110 degrees to 179.9 degrees from the polar orientation described above towards an (h k l) plane wherein l=0, and at least one of h and k is non-zero).

In another embodiment, the bulk gallium and nitrogen containing substrate is n-doped, and has an electrical resistivity smaller than 0.5 Ohm-cm, and in certain embodiments, less than 0.4 Ohm-cm, less than 0.3 Ohm-cm, less than 0.2 Ohm-cm, less than 0.1 Ohm-cm, and in certain embodiments, less than 0.05 Ohm-cm. In a preferred embodiment, the electrical resistivity is less than 0.05 Ohm-cm. Further, the aspect ratio of the LED (i.e. the ratio of its characteristic height to its characteristic lateral dimension) is at least 0.05. This enables efficient current spreading through the substrate and enables a uniform current density in the active region, across the device. This is exemplified in FIG. 16B, where it is shown that the electrons injected from the top n-contact spread efficiently and have a uniform profile when they reach the active region.

FIG. 17 is a top view of the LEDs shown in FIGS. 16A and 16B. As shown, the top view is substantially rectangular, however, other top view shapes are possible (e.g., triangles, squares, multi-sided polygonal shapes, irregular polygonal shapes, etc.). For example, a top view can be substantially in the shape of an equilateral triangle. In cases where the shape is not a regular polygon, a characteristic lateral dimension of the die may be defined as the longest distance across the shape.

Figure 18:
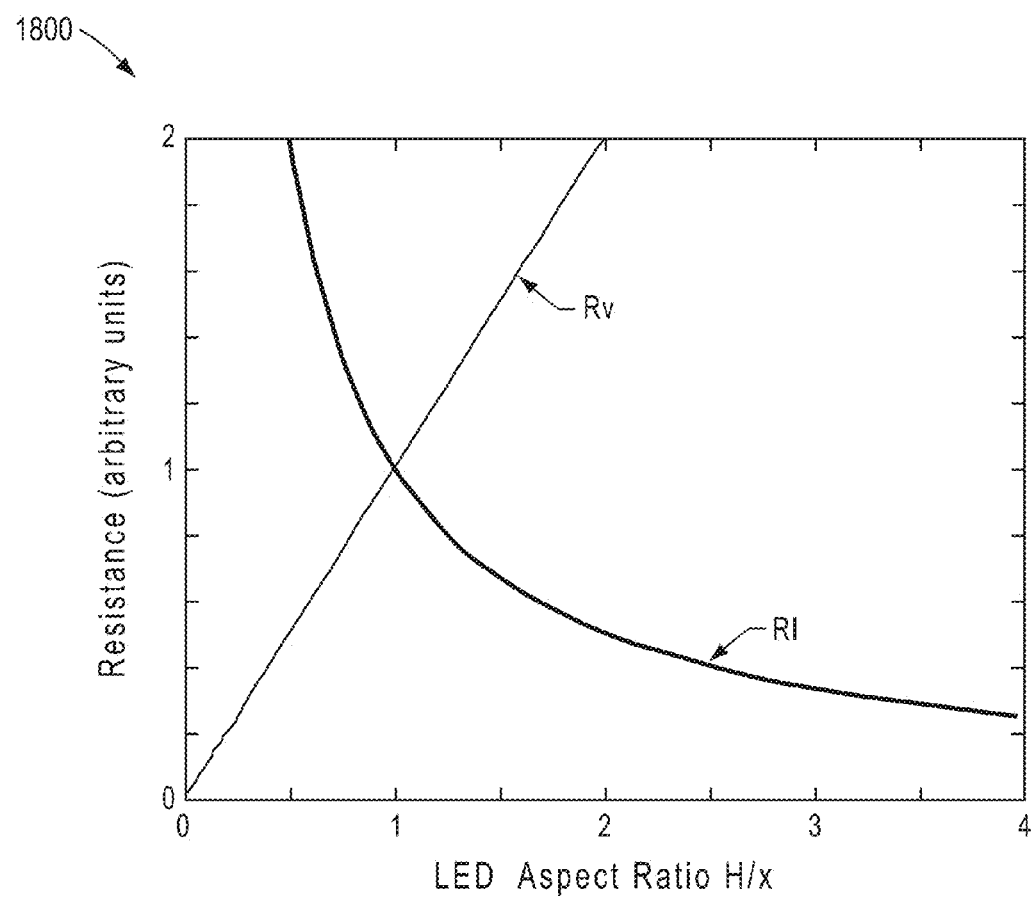
FIG. 18 is a plot of the lateral and vertical resistance in an LED as a function of its aspect ratio.

As shown in plot 1800 of FIG. 18, there is a tradeoff between thinning down an LED device (which makes current crowding problematic) and making the device very thick (which increases resistance). For a conducting element of resistivity r, area A and length L the resistance is R=r×L/A. Therefore, for an LED of lateral dimension x and height H, where the bulk substrate has resistivity r, two characteristic resistances can be defined: the vertical resistance Rv=r×H/x2, and the lateral resistance Rl=r×x/(x×H). Rv describes vertical resistance: a tall LED has more vertical resistance. Rl describes lateral resistance: a thin chip has more lateral resistance, and hence more current crowding. FIG. 18 depicts this tradeoff between Rv and Rl. A possible choice to mitigate this tradeoff is to require Rv=Rl, in which case we obtain x=H, e.g., the aspect ratio of the LED should be close to unity. Rl and Rv are approximate measures of the actual resistance of the device, and therefore the actual optimal aspect ratio may vary slightly from unity. FIG. 18 illustrates the tradeoff between lateral and vertical resistances and provides a rationale for an optimization objective function. Further, the precise value of the aspect ratio may be chosen to take into account other considerations besides electrical properties—such as optical effects.

In certain embodiments, the aspect ratio of the LED is at least 0.05 and less than 10 in order to mitigate the tradeoff between lateral and vertical resistance. In other embodiments, the aspect ratio of the LED is larger than 0.2 and less than 2. An experimental demonstration of such an embodiment is shown in FIG. 19A.

In certain embodiments, the aspect ratio of the longest lateral dimension to thickness of the light emitting diode is from 0.05 to 10, from 0.1 to 8, from 0.2 to 5, from 0.2 to 2, and in certain embodiments from 0.2 to 1.

Figure 19A:
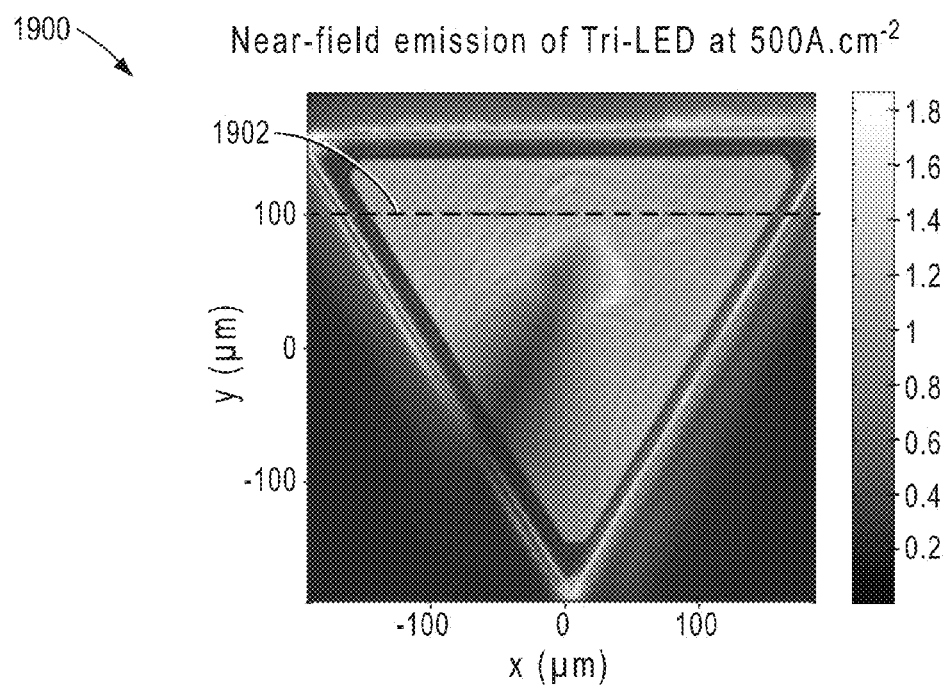
FIG. 19A is a microscope image of a lit-up LED according to an embodiment of the present invention.

FIG. 19A shows a top-view microscope image 1900 of a lit-up triangle-shaped LED on a bulk GaN substrate, under injection at a high current density of 500 A/cm$^{-2}$. The lateral dimension of the die is 380 μm and its height is 160 μm, hence an aspect ratio of 0.4. FIG. 19A depicts a plot line 1902 and showing that the light-up from the LED is uniform across the entire active region (see FIG. 19B).

Figure 19B:
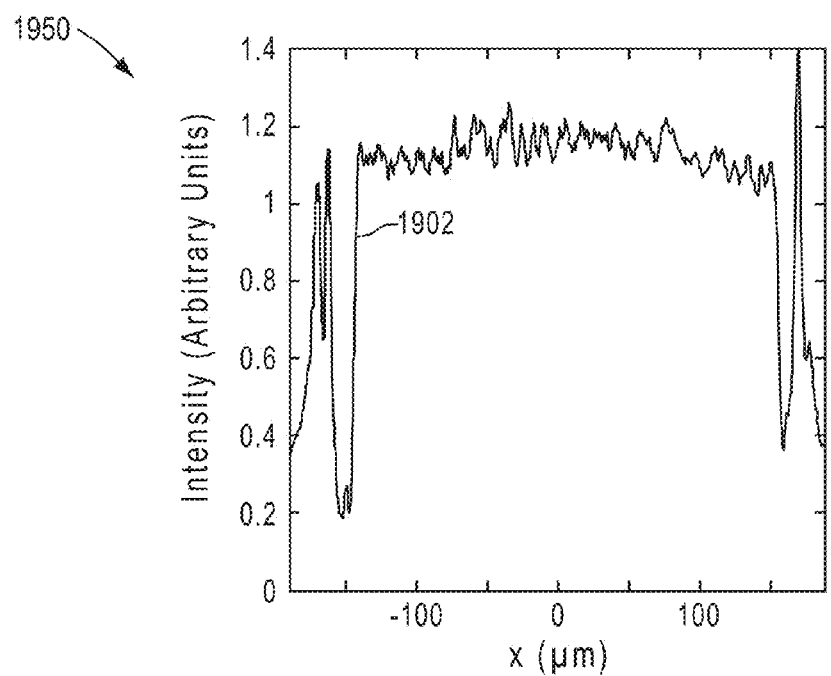
FIG. 19B is a cross-section of FIG. 19A and shows the light intensity profile across an LED according to an embodiment of the present invention.

FIG. 19B is a cross-section 1950 of FIG. 19A along the dashed line 1902 and further shows the result that across the LED, the intensity along dashed line 402 over a wide range of current density is nearly uniform (e.g., as shown by plot line 1902) and shows no sign of current crowding, even at high current density (e.g., as shown). This result can be contrasted to commercial LEDs with a thin GaN layer, which shows pronounced current crowding at high current densities (see callout 403).

While the above is a full description of the specific embodiments, various modifications, alternative constructions and equivalents may be used. Although the specification describes one or more specific gallium and nitrogen containing surface orientations, it would be recognized that any one of a plurality of family of plane orientations can be used. Therefore, the above description and illustrations should not be taken as limiting the scope of the present disclosure which is defined by the appended claims.

What is claimed is:

1. A light emitting diode (LED) having
a bulk gallium- and nitrogen-containing substrate;
an epitaxial stack comprising an n-type layer, an active region, and a p-type layer disposed on said substrate;
an electrical n-contact contacting said n-type layer;
an electrical p-contact contacting said p-type layer; and
wherein at least one of said substrate, epitaxial stack, said n-contact, and said p-contact is configured to reduce current crowding such that light emitted from the active region has an emission intensity varying no more than +/−20% across the active region at an input power per active region area greater than 2 watts/mm2.

2. The LED of claim 1, wherein the substrate is a bulk GaN substrate.

3. The LED of claim 1, wherein the light emitting diode is configured to emit light from the active region having an emission intensity varying no more than +/−10% across the active region at an input power per active region area greater than 2 watts/mm2.

4. The LED of claim 1, wherein the light emitting diode is configured to emit light from the active region having an emission intensity varying no more than +/−20% across the active region at an input power per active region area greater than 5 watts/mm2.

5. The LED of claim 4, wherein the light emitting diode is configured to emit light from the active region having an emission intensity varying no more than +/−10% across the active region, at an input power per active region area greater than 5 watts/mm2.

6. The LED of claim 1, wherein the LED is a flip-chip LED.

7. The LED of claim 1, wherein the LED emits light with a wavelength in a range of 390 nm to 480 nm.

8. The LED of claim 1, wherein the LED is characterized by a longest lateral dimension and a thickness, such that the ratio of the longest lateral dimension to the thickness is from 0.05 to 10.

9. The LED of claim 8, wherein the ratio of the longest lateral dimension to the thickness is from 0.2 to 5.

10. The LED of claim 1, wherein the substrate has a doping density above 1E17.

11. The LED of claim 1, wherein the substrate is characterized by a resistivity less than 0.5 Ohm·cm.

12. The LED of claim 11, wherein the substrate is characterized by a resistivity less than 0.05 Ohm·cm.

13. The LED of claim 1, wherein the LED emits substantially white light with a CRI above 75.

14. The LED of claim 1, wherein said substrate has a semipolar or non-polar orientation.

15. The LED of claim 1, wherein said substrate has a polar orientation.

16. The LED of claim 1, wherein the LED has a base area, and the active region covers at least 80% of the base area.

17. The LED of claim 16, wherein the active region covers at least 90% of the base area.

18. The LED of claim 16, wherein the base area is at least about 250 um×250 um.

19. The LED of claim 1, wherein the thickness of the LED is at least about 160 um.

20. The LED of claim 1, wherein the LED has an EQE of at least 50 at an input power per active region area greater than 2 watts/mm2.

* * * * *